(12) United States Patent
Sugizaki

(10) Patent No.: US 7,365,372 B2
(45) Date of Patent: Apr. 29, 2008

(54) SEMICONDUCTOR DEVICE AND METHOD FOR MANUFACTURING SEMICONDUCTOR DEVICE

(75) Inventor: Taro Sugizaki, Tokyo (JP)

(73) Assignee: Sony Corporation (JP)

( * ) Notice: Subject to any disclaimer, the term of this patent is extended or adjusted under 35 U.S.C. 154(b) by 94 days.

(21) Appl. No.: 11/482,693

(22) Filed: Jul. 10, 2006

(65) Prior Publication Data

US 2007/0012945 A1 Jan. 18, 2007

(30) Foreign Application Priority Data

Jul. 15, 2005 (JP) ............... 2005-206400
Feb. 24, 2006 (JP) ............... 2006-047652

(51) Int. Cl.
*H01L 29/74* (2006.01)
*H01L 29/744* (2006.01)
*H01L 29/745* (2006.01)

(52) U.S. Cl. ............... 257/122; 257/107; 257/119; 257/162; 257/E29.211; 257/E29.212; 257/E29.213; 257/E29.214

(58) Field of Classification Search ............... 257/107, 257/119, 122, 162, E29.211, E29.212, E29.213, 257/E29.214
See application file for complete search history.

(56) References Cited

U.S. PATENT DOCUMENTS

| | | | | |
|---|---|---|---|---|
| 4,620,213 A | * | 10/1986 | Arnould et al. | ............... 257/135 |
| 4,952,990 A | * | 8/1990 | Gruning | ............... 257/263 |
| 5,514,882 A | * | 5/1996 | Shulman | ............... 257/105 |
| 6,075,272 A | * | 6/2000 | Forbes et al. | ............... 257/378 |
| 6,462,359 B1 | | 10/2002 | Nemati et al. | |
| 6,657,240 B1 | * | 12/2003 | Chi | ............... 257/162 |
| 7,002,829 B2 | * | 2/2006 | Singh et al. | ............... 365/96 |
| 7,227,175 B2 | * | 6/2007 | Yang | ............... 257/15 |
| 7,304,327 B1 | * | 12/2007 | Nemati et al. | ............... 257/162 |
| 2002/0050615 A1 | * | 5/2002 | Ker et al. | ............... 257/355 |
| 2006/0231857 A1 | * | 10/2006 | Blanchard | ............... 257/107 |

OTHER PUBLICATIONS

Farid Nemati, et al., Fully Planar 0.562 μm² T-RAM Cell in a 130$_{nm}$ SOI CMOS Logic Technology for High-Density High-Performance SRAMs, IEEEE, 2004.
Farid Nemati, et al., "A Novel Thyristor-based SRAM Cell (T-RAM) for High-Speed, Low-VOltage, Giga-scale Memories", IEEE, 1999.
Farid Nemati, et al., "A Novel High Density, Low Voltage SRAM Cell with a Vertical NDR Device", IEEE, 1998.

* cited by examiner

*Primary Examiner*—Evan Pert
*Assistant Examiner*—Victor A. Mandala, Jr.
(74) *Attorney, Agent, or Firm*—Rader Fishman & Grauer PLLC; Ronald P. Kananen

(57) ABSTRACT

The present invention is to provide a semiconductor device including: a semiconductor layer that has a first-conductivity-type region, a second-conductivity-type region, a first-conductivity-type region, and a second-conductivity-type region that are adjacent to each other in that order; first and second electrodes that are connected to the first-conductivity-type region and the second-conductivity-type region, respectively, at both ends of the semiconductor layer; and a gate electrode that is coupled to the second-conductivity-type region or the first-conductivity-type region in an intermediate area of the semiconductor layer, the gate electrode being provided over a plurality of faces of a semiconductor layer portion serving as the second-conductivity-type region or the first-conductivity-type region in the intermediate area.

12 Claims, 17 Drawing Sheets

ON-STATE

OFF-STATE

SEMICONDUCTOR DEVICE AND METHOD FOR MANUFACTURING SEMICONDUCTOR DEVICE

CROSS REFERENCES TO RELATED APPLICATIONS

The present invention contains subject matter related to Japanese Patent Application JP 2005-206400 filed with the Japanese Patent Office on Jul. 15, 2005 and Japanese Patent Application JP 2006-047652 filed with the Japanese Patent Office on Feb. 24, 2006, the entire contents of which being incorporated herein by reference.

BACKGROUND OF THE INVENTION

1. Field of the Invention

The present invention relates to a thyristor-based semiconductor device and a method for manufacturing the semiconductor device.

2. Description of the Related Art

As shown in FIG. 15A, in a general thyristor-based semiconductor device, four layers of p-type regions (hereinafter, p-regions) p1 and p2 and n-type regions (hereinafter, n-regions) n1 and n2 are formed in such a manner that the p- and n-regions are in turn arranged to construct a p1/n1/p2/n2 structure. Furthermore, an anode electrode A is connected to the p-region p1 at one outermost end, while a cathode electrode K is connected to the n-region n2 at the other outermost end. Moreover, a gate electrode G is connected to the p-region p2 in an intermediate area. As the structures of such a thyristor, there are a vertical p1/n1/p2/n2 structure formed in a surface layer of a silicon substrate, and a horizontal p1/n1/p2/n2 structure formed by use of an SOI substrate.

In the semiconductor device with the above-described structure, as shown in FIG. 15B, upon application of a forward bias between the anode and cathode electrodes A and K, holes are supplied from the p-region p1 connected to the anode electrode A into the n-region n1, while electrons are supplied from the n-region n2 connected to the cathode electrode K into the p-region p2. These holes and electrons are recombined at the pn junction between the n-region n1 and the p-region p2, which leads to current flow, and thus the thyristor enters the on-state.

In contrast, applying a reverse bias between the anode and cathode electrodes A and K allows the thyristor to enter the off-state as shown in FIG. 15C. However, if merely a reverse bias is applied, it takes a time period as long as several milliseconds for the thyristor to enter the substantial off-state. Specifically, if the thyristor has entered the on-state, merely applying a reverse bias between the anode and cathode electrodes A and K does not drive the thyristor to spontaneously enter the off-state. In order for the thyristor to enter the off-state, there is a need that all excess carriers flowing in the n-region n1 and the p-region p2 be swept out of these regions or be recombined, by decreasing the current to below the holding current or turning power off.

Therefore, in order to switch the thyristor from the on-state to the off-state, in addition to application of a reverse bias between the anode and cathode electrodes A and K, application of voltage to the gate electrode provided over the p-region p2 is implemented. This voltage application provides an operation in which an electric field is generated in the p-region p2 and thus electrons as the excess carriers are forcibly discharged, so that the thyristor enters the substantial off-state more rapidly.

FIG. 16 shows the relationship, in the semiconductor device with the above-described structure, between the voltage (VAK) between the anode and cathode electrodes A and K and the current (I) flowing through this semiconductor device. As shown in FIG. 16, when the level of positive voltage applied to the anode A is increased and thus the voltage (VAK) reaches the critical voltage (VFB), the pn junction between the n-region n1 and the p-region p2 is forward biased. At this time, the voltage (VAK) decreases and a current larger than the holding current (IH) becomes to flow. In contrast, when the voltage (VAK) is lower than the critical voltage (VFB), the switching current (IS) smaller than the holding current (IH) flows. It is not until the voltage (VAK) surpasses the critical voltage (VFB) that a current larger than the holding current (IH) flows.

In order to further increase the speed of the above-described switching operation, proposals are made to provide a gate electrode based on a MOS structure in which an electrode film is formed over the p-region p2 with the intermediary of an insulating film therebetween. (The following documents are examples of the proposals: U.S. Pat. No. 6,462,359 B1; F. Nemati and J. Plummer, 1998, VLSI Tech., pp. 66; F. Nemati and J. Plummer, 1999, IEDM Tech., pp. 283; and F. Nemati et. al., 2004, IEDM Tech., pp. 273).

SUMMARY OF THE INVENTION

However, even with this gate electrode based on a MOS structure, similarly it takes some time periods for carriers in the p-region p2 to be discharged.

In recent years, an element structure in which a thyristor with the above-described structure is used as a memory has been proposed. Specifically, the operation of the thyristor is utilized as a memory, with the off-state of the thyristor being defined as the logical value zero, while the on-state of the thyristor as the logical value 1. In order to realize such an element, there is a need that the switching speed of the thyristor used as a memory be further enhanced.

Therefore, there is a need for the present invention to provide a thyristor-based semiconductor device that has high switching speed, and particularly can be switched from the on-state to the off-state at high speed. Furthermore, there is another need for the invention to provide a method for driving the semiconductor device and a method for manufacturing the semiconductor device.

According to an embodiment of the present invention to achieve such needs, there is provided a thyristor-based semiconductor device. The semiconductor device includes a semiconductor layer in which a first-conductivity-type region, a second-conductivity-type region, a first-conductivity-type region, and a second-conductivity-type region are adjacent to each other in that order. First and second electrodes are connected to the first-conductivity-type region and the second-conductivity-type region, respectively, at the both ends of the semiconductor layer. A gate electrode is coupled to the second-conductivity-type region or the first-conductivity-type region in an intermediate area of the semiconductor layer. The gate electrode is provided over a plurality of faces of a semiconductor layer portion serving as the second-conductivity-type region or the first-conductivity-type region in an intermediate area of the semiconductor layer.

According to other embodiments of the present invention, there are provided methods for manufacturing a semiconductor device with such a configuration. Two of these methods are to form two gate electrodes so that a semiconductor thin film formed through a substrate-applying method is sandwiched between the two gate electrodes. Another method is to pattern a semiconductor layer into a shape having a three-dimensional structure portion formed upright into a ridge shape, and form a gate electrode over three faces of the three-dimensional structure portion.

The driving method for the semiconductor device with the above-described structure is the same as that for a thyristor-based semiconductor device in the related art. Specifically, when the semiconductor device is turned on, a forward bias is applied between the electrodes of the first- and second-conductivity-type regions at the both ends. Thus, holes and electrons are recombined at the junction between the first- and second-conductivity-type regions in an intermediate area, which leads to current flow. When the semiconductor device in the on-state is switched to the off-state, a reverse bias is applied to the electrodes of the first- and second-conductivity-type regions at the both ends, and the gate electrode is provided with an intermediate potential between the potentials applied to the both end electrodes. Thus, an electric field is applied to the region coupled to the gate electrode, so that minority carriers are swept toward the electrode. In this turning off, the electric field is applied to the entire region coupled to the gate electrode efficiently since the gate electrode is provided over a plurality of faces of the semiconductor layer portion corresponding to the second- or first-conductivity-type region in an intermediate area in the semiconductor device of the embodiment in the present invention. Therefore, minority carriers in the intermediate region can be swept toward the end electrode rapidly.

As described above, according to the embodiments of the present invention, in switching of a semiconductor device from the on-state to the off-state, an electric field can be applied to the whole of a region in an intermediate area of the semiconductor device so that minority carriers can be swept out of the region. Therefore, the speed of switching from the on-state to the effective off-state can be enhanced.

DETAILED DESCRIPTION OF THE PREFERRED EMBODIMENTS

Embodiments of the present invention will be described in detail below with reference to the accompanying drawings. In the following descriptions of the respective embodiments, the first conductivity type is defined as the p type while the second conductivity type is defined as the n type. However, these types may be reversed, and in this case, the p- and n-types are exchanged with each other in the following descriptions.

First Embodiment

Figure 1:
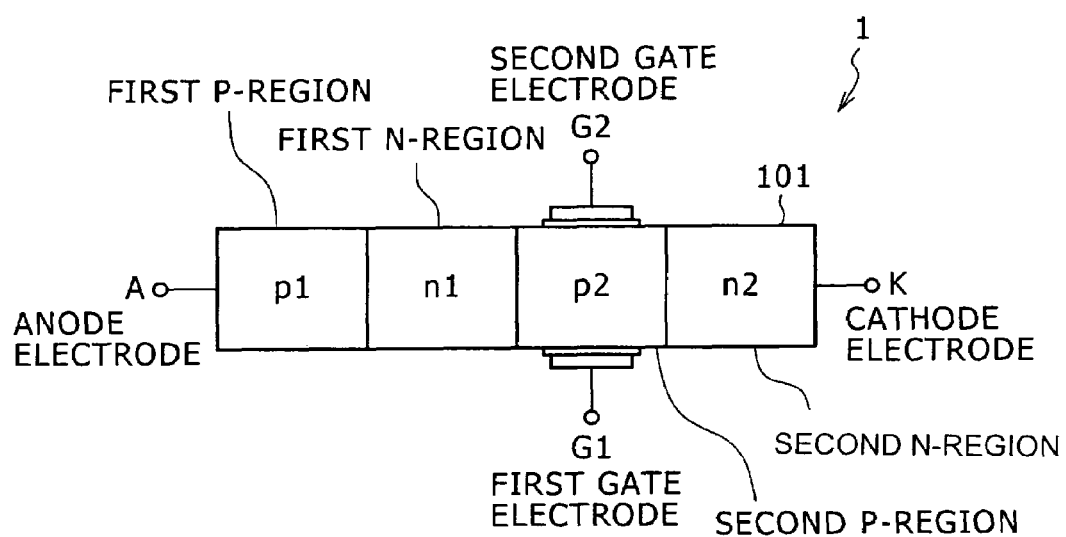
FIG. 1 is a diagram schematically illustrating the structure of a semiconductor device according to a first embodiment of the invention.
Figure 15A:
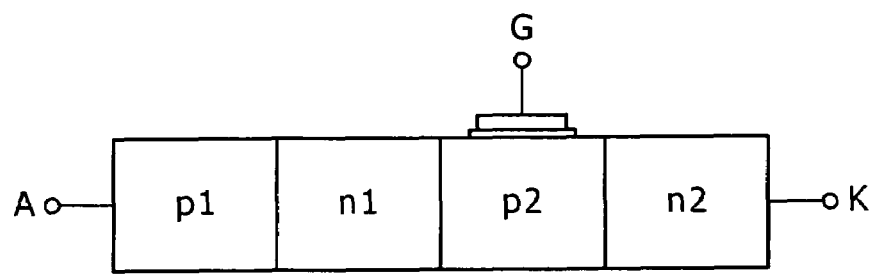
FIG. 15A is a diagram illustrating the structure of a thyristor-based semiconductor device in the related art.
Figure 15B:
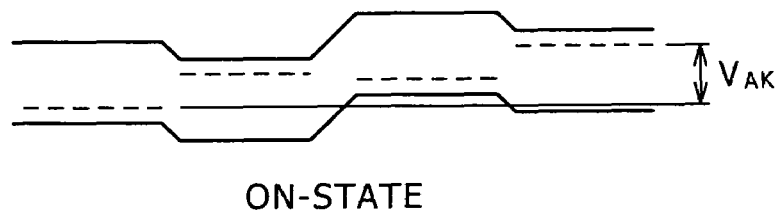
FIGS. 15B and 15C are diagrams showing the energy bands in the semiconductor device when the semiconductor device is in the on-state and off-state, respectively.
Figure 15C:
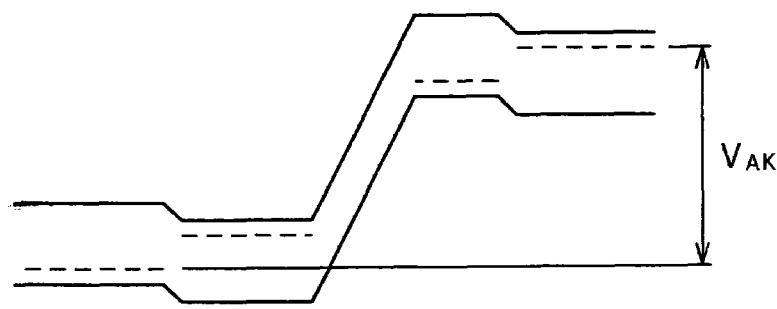
Figure 16:
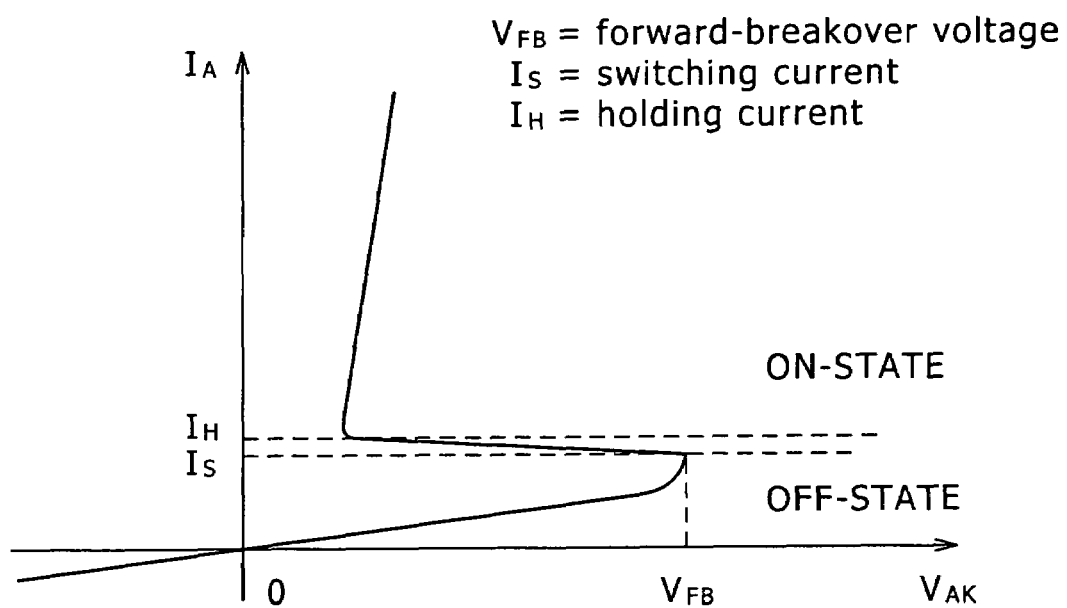
FIG. 16 is a diagram showing the V-I characteristic of the semiconductor device of FIG. 15A.

FIG. 1 is a diagram schematically illustrating the structure of a semiconductor device according to a first embodiment of the invention. A semiconductor device 1 shown in FIG. 1 is different from the semiconductor device of the related art described with FIG. 15A, in that gate electrodes G1 and G2 that can be controlled independently of each other are provided over opposed two faces of a p-region p2 formed in an intermediate area of the semiconductor device 1.

Specifically, the semiconductor device 1 includes a semiconductor layer 101 in which a first p-region p1 (hereinafter, referred to simply as a p-region p1), a first n-region n1 (hereinafter, referred to simply as an n-region n1), a second p-region p2 (hereinafter, referred to simply as a p-region p2), and a second n-region n2 (hereinafter, referred to simply as an n-region n2) are adjacent to each other in that order. Furthermore, an anode electrode A is connected to the p-region p1 at one outermost end, while a cathode electrode K is connected to the n-region n2 at the other outermost end. Moreover, the p-region p2 in an intermediate area is provided with two gate electrodes G1 and G2 so that these gate electrodes sandwich the p-region p2.

These gate electrodes G1 and G2 can be controlled independently of each other as described above, and therefore can apply different potentials to the p-region p2. These gate electrodes G1 and G2 may be formed based on a so-called MOS structure in which an electrode film is provided over the semiconductor layer 101 with the intermediary of a gate insulating film therebetween. Both the gate electrodes G1 and G2 may have a MOS structure, or alternatively only one of the electrodes may have a MOS structure. Further alternatively, both the electrodes may be provided through diffusion bonding of a metal material to the semiconductor layer 101.

If the semiconductor layer 101 is e.g. a semiconductor thin film provided on an insulating substrate, the gate electrodes G1 and G2 are provided as upper and lower electrodes that vertically sandwich the p-region p2 provided in the semiconductor thin film.

The semiconductor device 1 with this structure is driven as follows. In order to initially turn on the semiconductor device 1, a forward bias is applied between the anode and cathode electrodes A and K. At this time, it is preferable that a positive potential be applied to the gate electrodes G1 and G2 so that inversion layers are formed if the gate electrodes G1 and G2 have a MOS structure, or so that holes are supplied into the p-region p2 if the gate electrodes G1 and G2 are provided through metal bonding.

One example of the respective potentials when the semiconductor device 1 is turned on is as follows: the anode potential VA is 0.6 V, the cathode potential VK is 0 V, the gate potential VG1 is 0.6 V, and the gate potential VG2 is 0.3 V.

According to these potentials, holes are supplied from the p-region p1 connected to the anode electrode A into the n-region n1, while electrons are supplied from the n-region n2 connected to the cathode electrode K into the p-region p2. These holes and electrons are recombined at the pn junction between the n-region n1 and the p-region p2, which leads to current flow, and thus the thyristor enters the on-state.

Subsequently, a description will be made on switching from the above-described on-state to the off-state.

To turn off the semiconductor device 1, a reverse bias is applied between the anode and cathode electrodes A and K. It is important to set the anode potential VA applied to the anode electrode A and the cathode potential VK applied to the cathode electrode K so that the pn junction between the n-region n2 and the p-region p2 is reverse biased. Simultaneously with the application of a reverse bias, intermediate potentials between the anode and cathode potentials VA and VK are applied to the gate electrodes G1 and G2 provided over the p-region p2. That is, the gate potentials VG1 and VG2 are set so that the relationship VA<VG1, VG2<VK is satisfied.

One example of the respective potentials when the semiconductor device 1 is turned off is as follows: the anode potential VA is 0.6 V, the cathode potential VK is 1.2 V, and both the gate potentials VG1 and VG2 are 0.9 V.

According to these potentials, since the relationship VA<VG1, VG2<VK is satisfied, the pn junction between the p-region p2 and the n-region n2 is reverse biased. Thus, minority carriers (electrons) that have been supplied from the n-region n2 to the p-region p2 when the semiconductor device 1 is in the on-state are swept toward the n-region n2, which stops the current flow due to the recombination of minority carriers at the pn junction between the n-region n1 and the p-region p2.

In particular, the semiconductor device 1 of the first embodiment has a structure in which the gate electrodes G1 and G2 are provided over opposed two faces sandwiching the intermediate p-region p2. Therefore, an electric field can be applied from these gate electrodes G1 and G2 to the entire p-region p2 efficiently. Accordingly, minority carriers (electrons) in the p-region p2 can be swept toward the end cathode electrode K rapidly. As a result, the speed of switching from the on-state to the effective off-state can be enhanced.

If in the semiconductor device 1 of the first embodiment, two gate electrodes G1 and G2 provided over the p-region p2 can be controlled independently of each other, the gate electrodes G1 and G2 may be separately provided with different potentials in the above-described range. The application of different potentials allows finer control of an electric field in the p-region p2.

A method for manufacturing the semiconductor device 1 of the first embodiment will be described below with reference to FIGS. 2A to 2I, which are sectional views showing manufacturing steps.

Figure 2A:
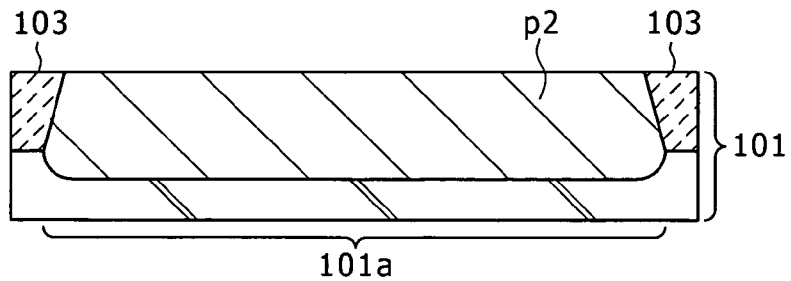
FIGS. 2A to 2I are step diagrams showing a manufacturing method for the semiconductor device of the first embodiment.

Referring initially to FIG. 2A, near a surface of the semiconductor substrate (semiconductor layer) 101 composed of monocrystalline silicon, element isolators 103 composed of silicon oxide are formed so that the surface region of the semiconductor layer 101 is separated into the respective active regions 101a. The element isolators 103 may be formed based on LOCOS (local oxidation of silicon), or may be formed based on STI (shallow trench isolation). It is preferable that the thickness of the element isolators 103 be about 30 to 300 nm since the element isolators 103 are used as a stopper when the semiconductor substrate 101 is later polished from the backside thereof by CMP (chemical mechanical polishing).

After the formation of the element isolators 103, the p-region p2 is formed in the surface layer of the active region 101a through ion implantation. In this ion implantation, the p-type dopant to be introduced for the p-region p2 is e.g. boron (B), and the dose thereof is e.g. $5 \times 10^{18}/cm^3$ (hereinafter, expressed as $5E18/cm^3$), and is preferably about $1E18$ to $1E19/cm^3$. The p-type dopant may be indium (In).

Figure 2B:
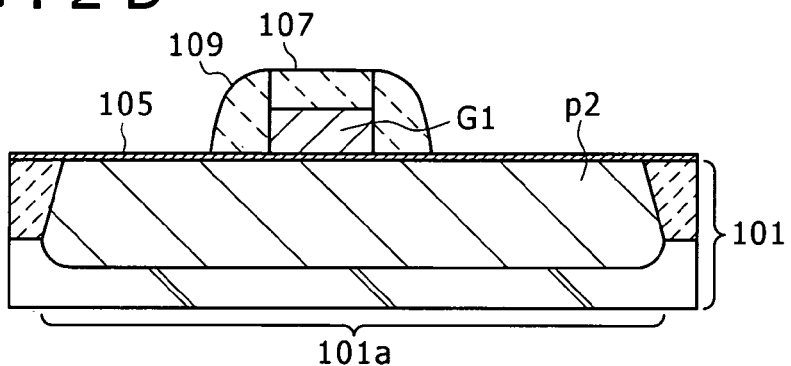

Referring next to FIG. 2B, a gate insulating film 105 is formed on the surface of the semiconductor substrate 101. The gate insulating film 105 is formed by depositing e.g. an $SiO_2$ film to a film thickness of about 1 to 10 nm. The gate insulating film 105 is not limited to a film composed of $SiO_2$, but may be formed of another material that is applicable to a gate insulating film of a typical CMOS, such as SiON, $HfO_2$, HfON, $Al_2O_3$, HfSiO, HfSiON, or $La_2O_3$.

After the formation of the gate insulating film 105, a gate electrode G1 for applying voltage to the p-region p2 is formed on the gate insulating film 105 as the first gate electrode G1. The first gate electrode G1 is disposed in a manner of traversing an intermediate area of the p-region p2 (active region 101a). The first gate electrode G1 is formed of poly-silicon, silicon-germanium, or a metal. In the formation of the first gate electrode G1, a multilayer structure of an electrode material film and an insulating film is patterned, so that an offset insulating film 107 is provided on the first gate electrode G1. As the material of the offset insulating film 107, $SiO_2$ or $Si_3N_4$ is used.

Subsequently, an insulating sidewall 109 is formed on the side faces of the first gate electrode G1 and the offset insulating film 107 thereon. The sidewall 109 may be formed of either of an $SiO_2$ or $Si_3N_4$ film, or alternatively may be formed of a multilayer film of these films.

Figure 2C:
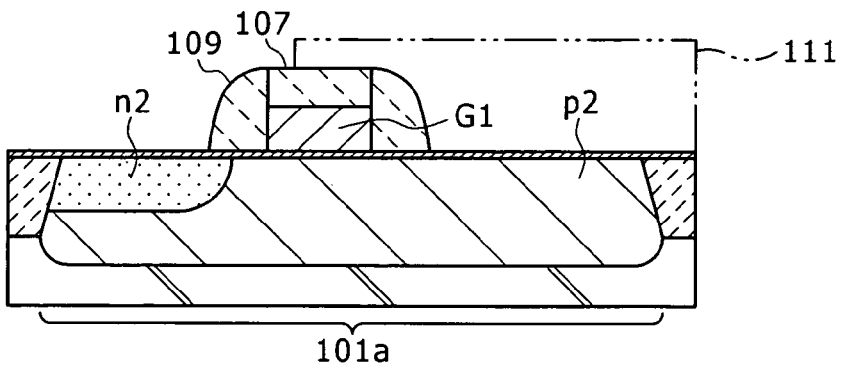

Referring next to FIG. 2C, a resist pattern 111 having such a shape that the active region 101a (p-region p2) on one side of the first gate electrode G1 is exposed while the other part is covered is formed. Subsequently, ion implantation is carried out with use of the resist pattern 111, the offset insulating film 107, and the sidewall 109 as the mask, to thereby form the n-region n2 connected to the pre-formed p-region p2. In this ion implantation, the n-type dopant to be introduced for the n-region n2 is e.g. phosphorous (P), and the dose thereof is e.g. $1E19/cm^3$, and is preferably about 1E18 to 1E21/cm³. However, since the n-region n2 is provided inside the pre-formed p-region p2, the concentration of the n-type dopant to be introduced for the n-region n2 needs to be higher than that of the p-type dopant introduced for the p-region p2. The n-type dopant may be arsenic (As) or antimony (Sb) instead of phosphorous (P).

After the ion implantation, the resist pattern 111 is removed, followed by activation annealing for the dopants introduced into the semiconductor substrate 101 through the above-described steps. As the activation annealing, e.g. spike annealing at 1050° C. for zero second is carried out. The annealing condition may be any as long as the dopants can be activated.

Figure 2D:
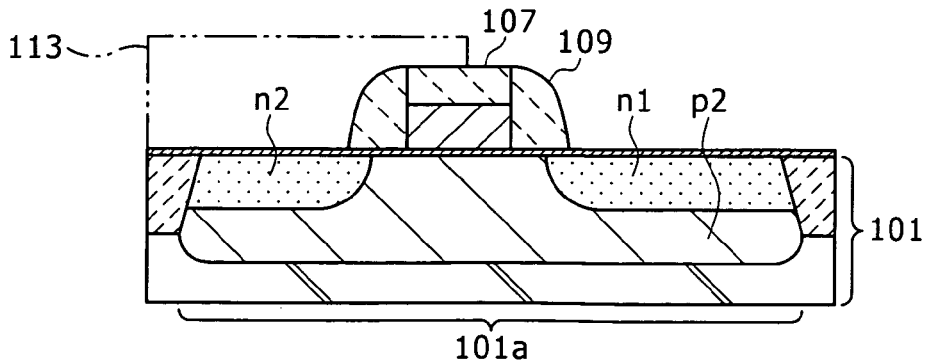

Referring next to FIG. 2D, a resist pattern 113 having such a shape that the pre-formed n-region n2 is covered while the active region 101a (p-region p2) on the other side of the first gate electrode G1 is exposed is formed. Subsequently, ion implantation is carried out with use of the resist pattern 113, the offset insulating film 107, and the sidewall 109 as the mask, to thereby form the n-region n1 connected to the pre-formed p-region p2. In this ion implantation, the n-type dopant to be introduced for the n-region n1 is e.g. phosphorous (P), and the dose thereof is e.g. 1.5E19/cm³, and preferably about 1E18 to 1E20/cm³. However, since the n-region n1 is provided inside the pre-formed p-region p2, the concentration of the n-type dopant to be introduced for the n-region n1 needs to be higher than that of the p-type dopant introduced for the p-region p2. The n-type dopant may be arsenic (As) or antimony (Sb) instead of phosphorous (P).

After the ion implantation, the resist pattern 113 is removed, followed by activation annealing for the dopant introduced into the semiconductor substrate 101 through the above-described step. As the activation annealing, e.g. spike annealing at 1050° C. for zero second is carried out. The annealing condition may be any as long as the dopant can be activated.

The sidewall 109, which has been formed, may be formed after the formation of the n-region n1.

Figure 2E:
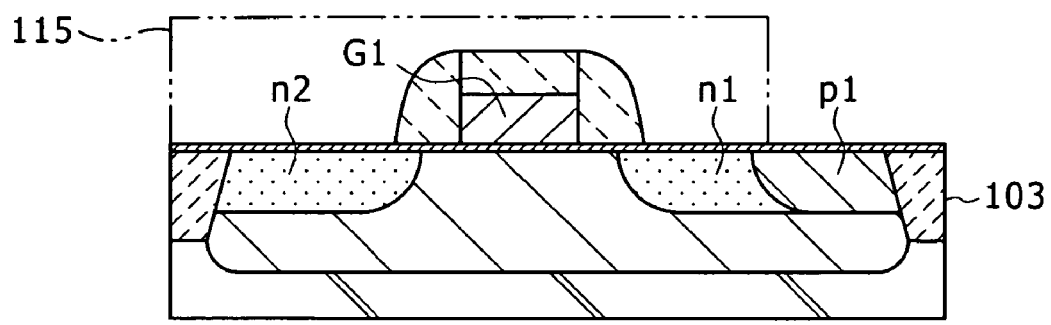

Referring next to FIG. 2E, a resist pattern 115 is formed. This resist pattern 115 has such a shape that the first gate electrode G1, the entire n-region n2, and one part of the n-region n1 close to the first gate electrode G1 are covered while the other part of the n-region n1 connected to the element isolator 103 is exposed. Subsequently, by ion implantation with use of the resist pattern 115 as the mask, the p-region p1 is formed inside the pre-formed n-region n1. In this ion implantation, the p-type dopant to be introduced for the p-region p1 is e.g. boron (B), and the dose thereof is e.g. 1E20/cm³, and is preferably about 1E18 to 1E21/cm³. However, since the p-region p1 is provided inside the pre-formed n-region n1, the concentration of the p-type dopant to be introduced for the p-region p1 needs to be higher than that of the n-type dopant introduced for the n-region n1. The p-type dopant may be indium (In) instead of boron (B).

After the ion implantation, the resist pattern 115 is removed, followed by activation annealing for the p-type dopant introduced for the p-region p1. As the activation annealing, e.g. spike annealing at 1000° C. for zero second is carried out. The annealing condition may be any as long as the dopant can be activated.

Figure 2F:
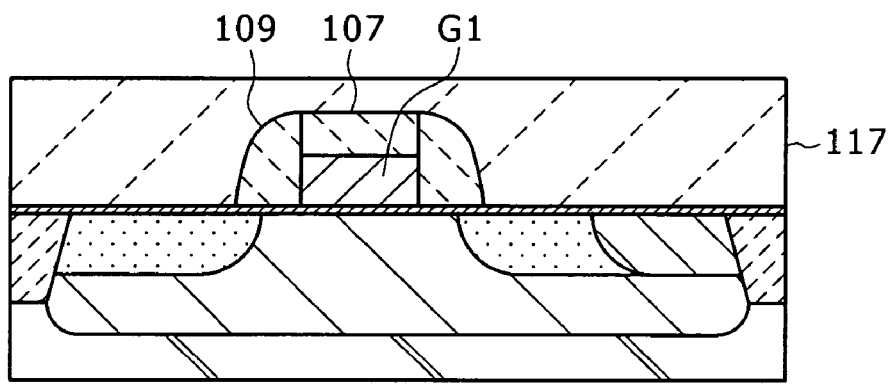

Referring next to FIG. 2F, a planarization insulating film 117 is formed to cover the first gate electrode G1, the offset insulating film 107 and the sidewall 109. The planarization insulating film 117 is formed by depositing a silicon oxide film by CVD and then planarizing the film by CMP, for example.

Figure 2G:
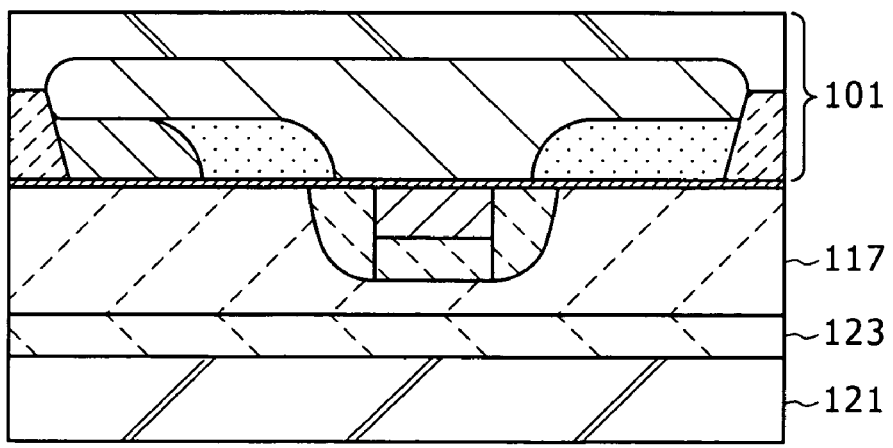

Referring next to FIG. 2G, another semiconductor substrate composed of monocrystalline silicon is prepared as a handle substrate 121. On the surface of the handle substrate 121, a silicon oxide film 123 is formed. Subsequently, the handle substrate 121 and the semiconductor substrate 101 are coupled to each other in such a manner that the silicon oxide film 123 on the handle substrate 121 is applied to the planarization insulating film 117, formed of a silicon oxide film, over the semiconductor substrate 101.

Figure 2H:
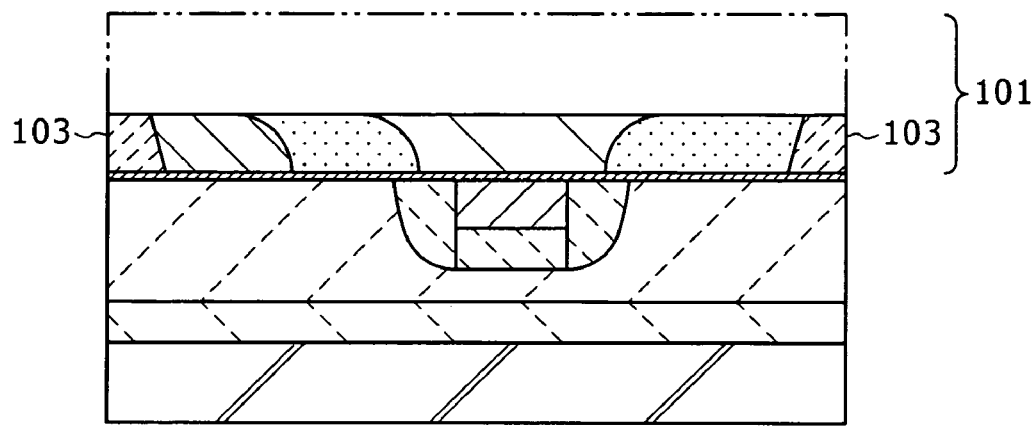

Subsequently, as shown in FIG. 2H, the semiconductor substrate 101 is polished from the backside thereof so as to be processed into a semiconductor layer formed of a semiconductor thin film. In this polishing, the element isolators 103 composed of silicon oxide serve as the stopper, and as a result, the p-regions p1 and p2 are isolated from each other by the n-region n1 while the n-regions n1 and n2 are isolated from each other by the p-region p2.

Figure 2I:
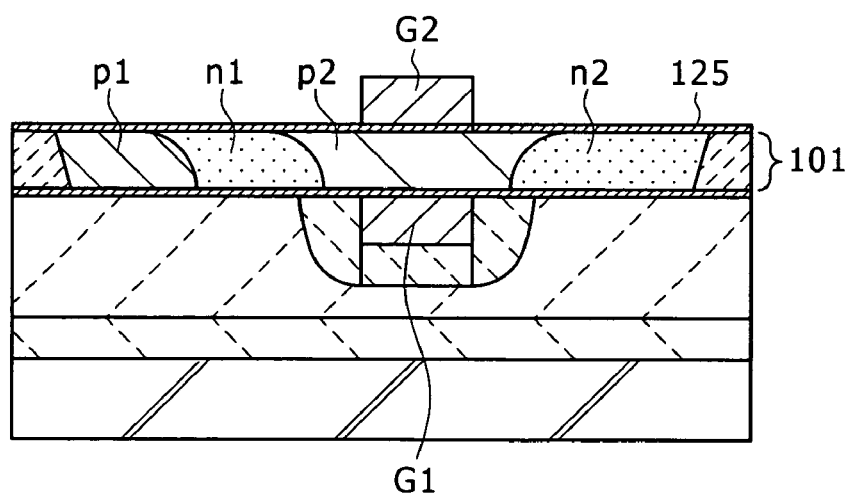

Referring next to FIG. 2I, a gate insulating film 125 is formed on the polished surface (back surface) of the semiconductor substrate (semiconductor layer) 101. The gate insulating film 125 is formed by depositing e.g. an SiO₂ film to a film thickness of about 1 to 10 nm. Similarly to the pre-formed gate insulating film 105, a material applicable to a gate insulating film of a typical CMOS can be used for the gate insulating film 125.

After the formation of the gate insulating film 125, a gate electrode G2 for applying voltage to the p-region p2 is formed on the gate insulating film 125 as the second gate electrode G2. The second gate electrode G2 is disposed so that it traverses the intermediate area of the p-region p2 (active region 101a) and is opposed to the first gate electrode G1 with the intermediary of the p-region p2 therebetween. The second gate electrode G2 is formed of poly-silicon, silicon-germanium, or a metal, similarly to the first gate electrode G1.

After the above-described step, the anode electrode A connected to the p-region p1 and the cathode electrode K connected to the n-region n2 are formed. To provide the electrodes, a silicide (TiSi, CoSi, NiSi, etc.) is formed through a salicide process on exposed part of the p-region p1 and the n-region n2 at the both ends, followed by a wiring step similar to one in a typical CMOS process.

Through the above-described steps, the semiconductor device 1 of the first embodiment, in which the first and second gate electrodes G1 and G2 sandwich the p-region p2 in an intermediate area as shown in FIG. 1, can be completed.

In the above-described manufacturing method for the first embodiment, the n-regions n1 and n2 and the p-regions p1 and p2 are formed before the semiconductor substrate 101 is processed into a semiconductor layer formed of a semiconductor thin film through applying of substrates and polishing described with FIGS. 2G and 2H. However, the n-regions n1 and n2 and the p-regions p1 and p2 may be formed after the processing of the semiconductor substrate 101 into a semiconductor layer formed of a semiconductor thin film.

A step procedure example if doing so is as follows. Specifically, the element isolators 103 and the p-region p2 are formed in the semiconductor substrate 101, and then the gate insulating film 105 is deposited, followed by the formation of the first gate electrode G1 thereon. Thereafter, a planarization insulating film is formed, and then a substrate applying step is carried out. Subsequently, the semiconductor substrate 101 is polished to be turned into a semiconductor thin film. Next, the second gate electrode is formed to traverse the p-region p2 with the intermediary of a gate insulating film therebetween, followed by the formation of the n-regions n2 and n1 and the p-region p1 through the same procedure as that described with FIGS. 2C to 2E.

Alternatively, the following step procedure is also available. Specifically, the gate insulating film 105 and the first gate electrode G1 thereon are formed before the formation of the element isolators 103 and the p-region p2 in the semiconductor substrate 101. Thereafter, a planarization insulating film is formed, and then a substrate-applying step is carried out. Subsequently, the semiconductor substrate 101 is polished to be turned into a semiconductor thin film. Next, the p-region p2 is formed, and then the second gate electrode is formed to traverse the p-region p2 with the intermediary of a gate insulating film therebetween, followed by the formation of the n-regions n2 and n1 and the p-region p1 through the same procedure as that described with FIGS. 2C to 2E.

Second Embodiment

Figure 3:
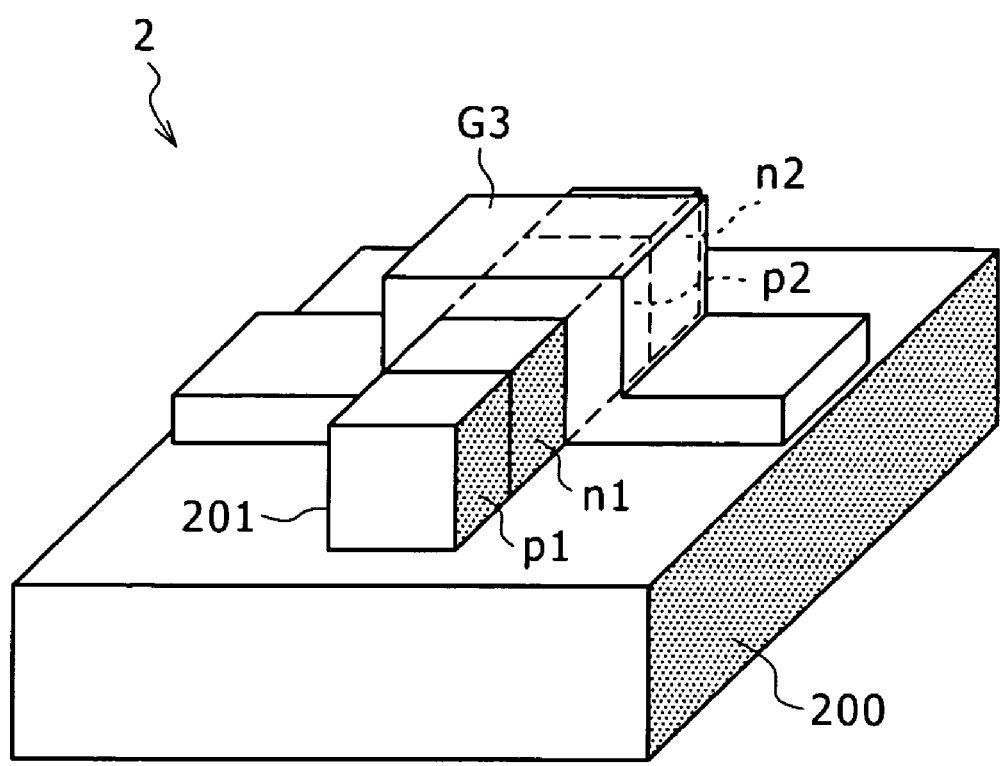
FIG. 3 is a diagram schematically illustrating the structure of a semiconductor device according to a second embodiment of the invention.

FIG. 3 is a diagram schematically illustrating the structure of a semiconductor device according to a second embodiment of the invention. A semiconductor device 2 in FIG. 3 is different from the semiconductor device of the first embodiment described with FIG. 1 in that a gate electrode G3 is provided across three faces of a p-region p2.

The semiconductor device 2 includes a semiconductor layer 201 in which a p-region p1, an n-region n1, the p-region p2, and an n-region n2 are adjacent to each other in that order. The semiconductor layer 201 has a three-dimensional fin structure that arises from processing of a semiconductor thin film of an SOI substrate into a ridge shape extending in one direction for example. The semiconductor layer 201 is provided on an insulating film 200 such as a buried oxide (BOX) film. The p-region p1, the n-region n1, the p-region p2 and the n-region n2 are sequentially provided along the extension direction of the semiconductor layer 201.

Furthermore, although not shown in the drawing, an anode electrode A is connected to the p-region p1 at one outermost end, while a cathode electrode K is connected to the n-region n2 at the other outermost end. In addition, the gate electrode G3 is provided to have a continuous shape over three faces of the p-region p2 in an intermediate area. The gate electrode G3 may be formed based on a MOS structure in which an electrode film is deposited over the semiconductor layer 201 with the intermediary of a gate insulating film (not shown) therebetween. Alternatively, the gate electrode G3 may be formed through diffusion bonding of a metal material to the semiconductor layer 201.

The driving method for the semiconductor device 2 with the above-described structure is the same as that for the semiconductor device of the first embodiment.

In the semiconductor device 2 having the above-described structure, the gate electrode G3 is provided across plural faces of the p-region p2 in an intermediate area. Therefore, similarly to the first embodiment, an electric field can be applied from the gate electrode G3 to the entire p-region p2 efficiently, which can enhance the speed of switching from the on-state to the effective off-state.

A method for manufacturing the semiconductor device 2 of the second embodiment will be described below with reference to step diagrams of FIGS. 4A to 4F.

Figure 4A:
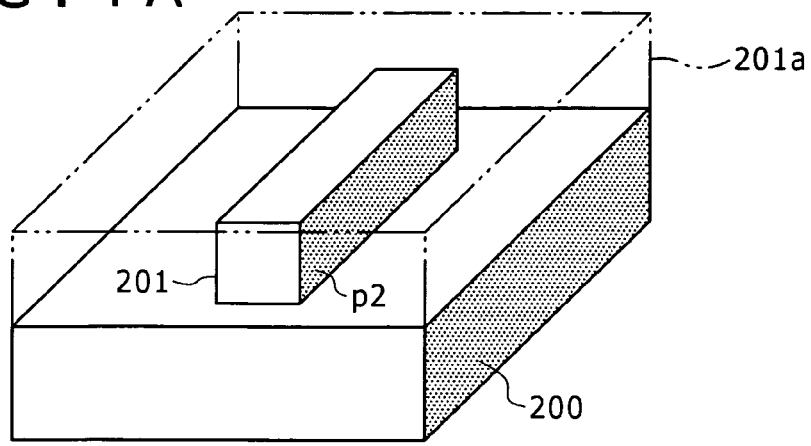
FIGS. 4A to 4F are step diagrams showing a manufacturing method for the semiconductor device of the second embodiment.

Referring initially to FIG. 4A, a semiconductor thin film 201a formed on the insulating film 200 of an SOI substrate is patterned into a ridge shape extending in one direction, to thereby form the semiconductor layer 201 processed into a three-dimensional fin structure. The semiconductor layer 201 serves as an active region.

Subsequently, the p-region p2 is formed in the entire semiconductor layer 201 through ion implantation. In this ion implantation, the p-type dopant to be introduced for the p-region p2 is e.g. boron (B), and the dose thereof is e.g. $5E18/cm^3$, and is preferably about $1E18$ to $1E19/cm^3$. The p-type dopant may be indium (In).

Subsequently, the formation of a sacrificial oxide film for eliminating damage on the semiconductor layer 201 and etch-removal of the sacrificial oxide film are carried out according to need. Thereafter, a gate insulating film is formed on the surface of the semiconductor layer 201 although not illustrated in the drawing. The gate insulating film is formed by depositing e.g. an $SiO_2$ film to a film thickness of about 1 to 10 nm. The gate insulating film 105 is not limited to a film composed of $SiO_2$, but may be formed of another material that is applicable to a gate insulating film of a typical CMOS, such as SiON, $HfO_2$, HfON, $Al_2O_3$, HfSiO, HfSiON, or $La_2O_3$.

Figure 4B:
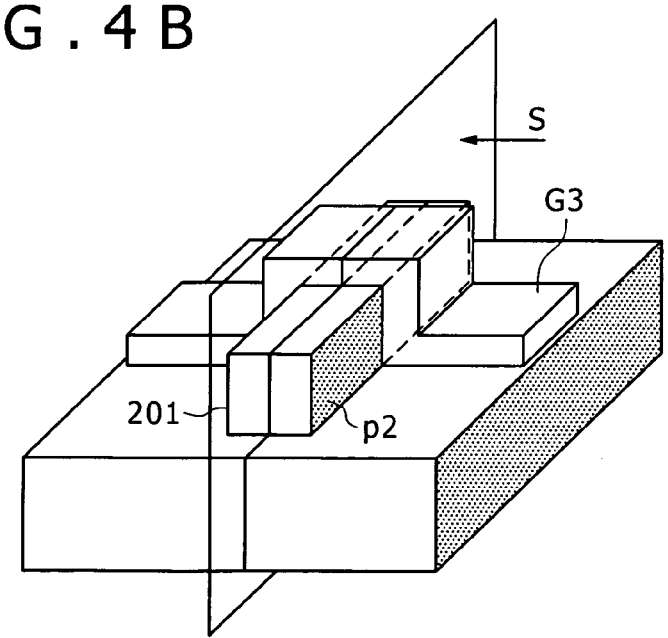

Referring next to FIG. 4B, the gate electrode G3 for applying voltage to the p-region p2 is formed over the semiconductor layer 201 with the intermediary of the gate insulating film therebetween. The gate electrode G3 is disposed so as to traverse an intermediate area of the p-region p2 (semiconductor layer 201). The gate electrode G3 is formed of poly-silicon, silicon-germanium, or a metal.

The description of the subsequent steps is based on sectional views. The sectional views subsequent to FIG. 4B correspond to diagrams obtained when the plane S in FIG. 4B is viewed in the arrowhead direction.

Figure 4C:
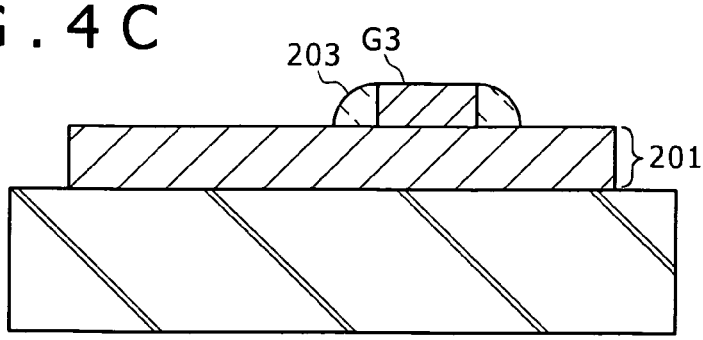

Referring to FIG. 4C, an insulating sidewall 203 is formed on the side faces of the gate electrode G3. The sidewall 203 may be formed of either of an $SiO_2$ or $Si_3N_4$ film, or alternatively may be formed of a multilayer film of these films. In this sidewall forming step, a sidewall is also formed on the side faces of the semiconductor layer 201 although not illustrated in the drawing. Note that in FIG. 3, the illustration of the sidewall 203 is omitted. This sidewall forming step may be omitted if there is no need.

Figure 4D:
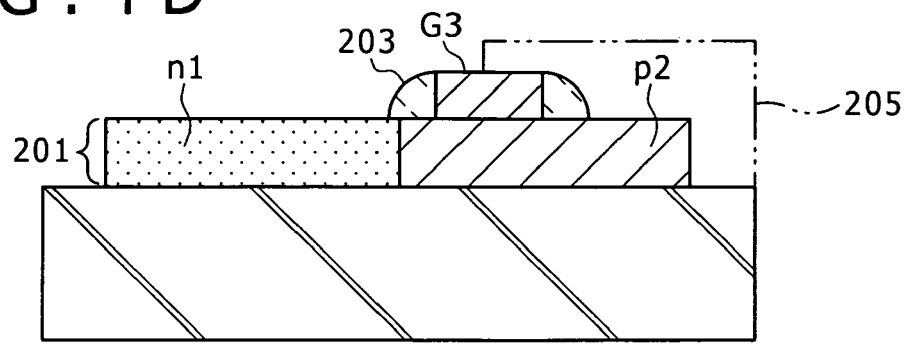

Referring next to FIG. 4D, a resist pattern 205 having such a shape that the semiconductor layer 201 on one side of the gate electrode G3 is exposed while the other part is covered is formed. Subsequently, ion implantation is carried out with use of the resist pattern 205, the gate electrode G3, and the sidewall 203 as the mask, to thereby form the n-region n1 connected to the pre-formed p-region p2. In this ion implantation, the n-type dopant to be introduced for the n-region n1 is e.g. phosphorous (P), and the dose thereof is e.g. $1.5E19/cm^3$, and is preferably about $1E18$ to $1E20/cm^3$. However, since the n-region n1 is provided inside the pre-formed p-region p2, the concentration of the n-type dopant to be introduced for the n-region n1 needs to be higher than that of the p-type dopant introduced for the p-region p2. The n-type dopant may be arsenic (As) or antimony (Sb) instead of phosphorous (P).

After the ion implantation, the resist pattern 205 is removed, followed by activation annealing for the dopants introduced into the semiconductor layer 201 through the above-described steps. As the activation annealing, e.g. spike annealing at 1050° C. for zero second is carried out. The annealing condition may be any as long as the dopants can be activated.

Figure 4E:
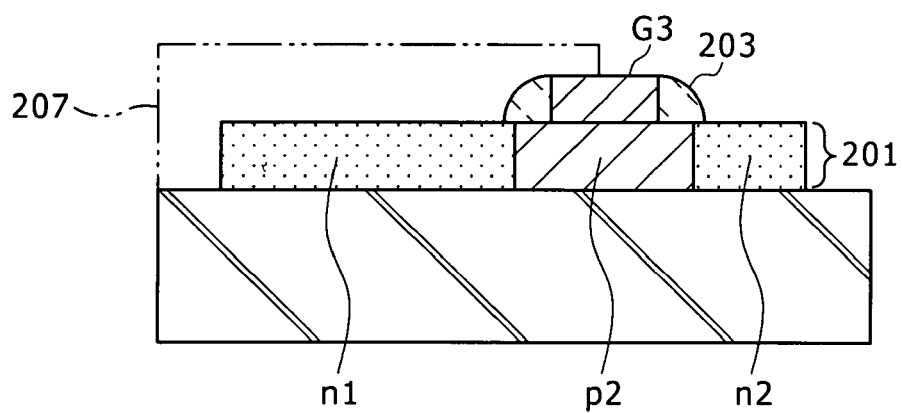

Referring next to FIG. 4E, a resist pattern 207 having such a shape that the pre-formed n-region n1 is covered while the semiconductor layer 201 on the other side of the gate electrode G3 is exposed is formed. Subsequently, ion implantation is carried-out with use of the resist pattern 207, the gate electrode G3, and the sidewall 203 as the mask, to thereby form the n-region n2 connected to the pre-formed p-region p2. In this ion implantation, the n-type dopant to be introduced for the n-region n2 is e.g. phosphorous (P), and the dose thereof is e.g. $1E19/cm^3$, and is preferably about $1E18$ to $1E21/cm^3$. However, since the n-region n2 is provided inside the pre-formed p-region p2, the concentration of the n-type dopant to be introduced for the n-region n2 needs to be higher than that of the p-type dopant introduced for the p-region p2. The n-type dopant may be arsenic (As) or antimony (Sb) instead of phosphorous (P).

After the ion implantation, the resist pattern 207 is removed, followed by activation annealing for the dopant introduced into the semiconductor layer 201 through the above-described step. As the activation annealing, e.g. spike annealing at 1050° C. for zero second is carried out. The annealing condition may be any as long as the dopant can be activated.

Figure 4F:
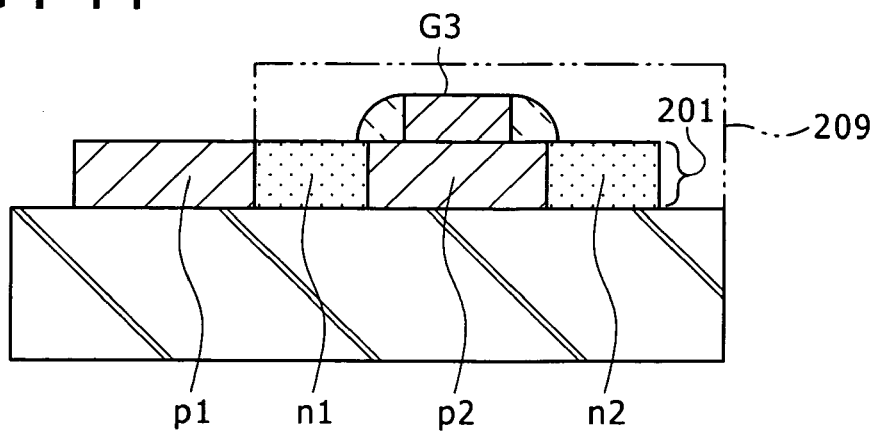

Referring next to FIG. 4F, a resist pattern 209 is formed. This resist pattern 209 has such a shape that the gate electrode G3, the entire n-region n2, and part of the n-region n1 close to the gate electrode G3 are covered while end part of the semiconductor layer 201 is exposed. Subsequently, by ion implantation with use of the resist pattern 209 as the mask, the p-region p1 is formed in end part of the pre-formed n-region n1. In this ion implantation, the p-type dopant to be introduced for the p-region p1 is e.g. boron (B), and the dose thereof is e.g. $1E20/cm^3$, and is preferably about $1E18$ to $1E21/cm^3$. However, since the p-region p1 is provided inside the pre-formed n-region n1, the concentration of the p-type dopant to be introduced for the p-region p1 needs to be higher than that of the n-type dopant introduced for the n-region n1. The p-type dopant may be indium (In) instead of boron (B).

After the ion implantation, the resist pattern 209 is removed, followed by activation annealing for the p-type dopant introduced for the p-region p1. As the activation annealing, e.g. spike annealing at 1000° C. for zero second is carried out. The annealing condition may be any as long as the dopant can be activated.

After the above-described step, the anode electrode A connected to the p-region p1 and the cathode electrode K connected to the n-region n2 are formed. To provide the electrodes, a silicide (TiSi, CoSi, NiSi, etc.) is formed through a salicide process on an exposed part of the p-region p1 and the n-region n2 at the both ends, followed by a wiring step similar to one in a typical CMOS process.

Through the above-described steps, the semiconductor device 2 of the second embodiment shown in FIG. 3 can be completed.

Third Embodiment

Figure 5A:
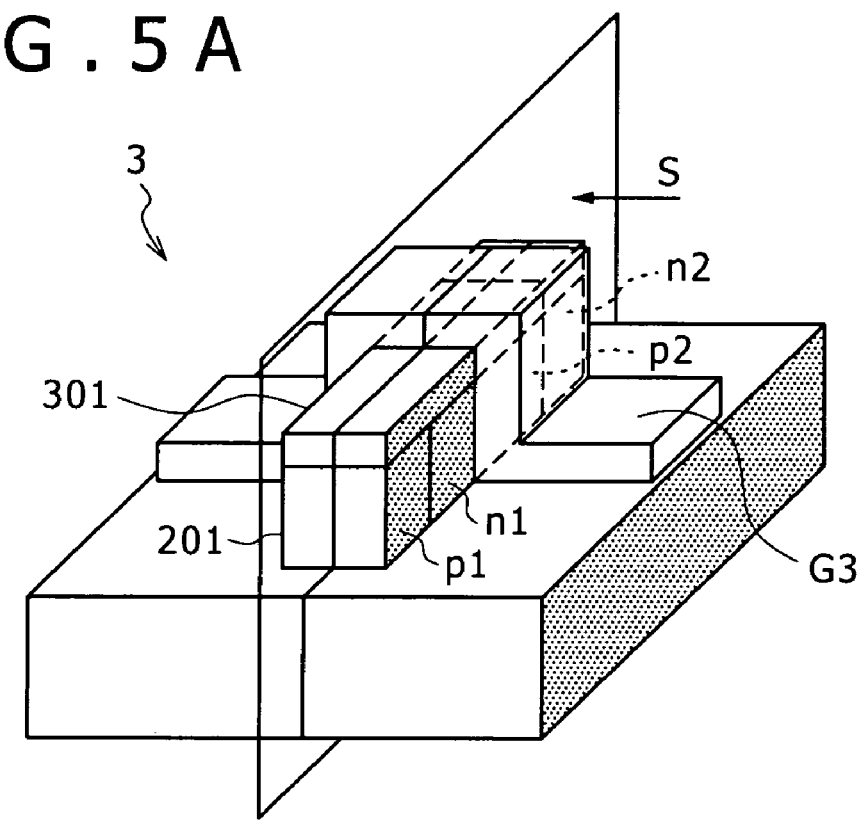
FIGS. 5A and 5B are diagrams schematically illustrating the structure of a semiconductor device according to a third embodiment of the invention.
Figure 5B:
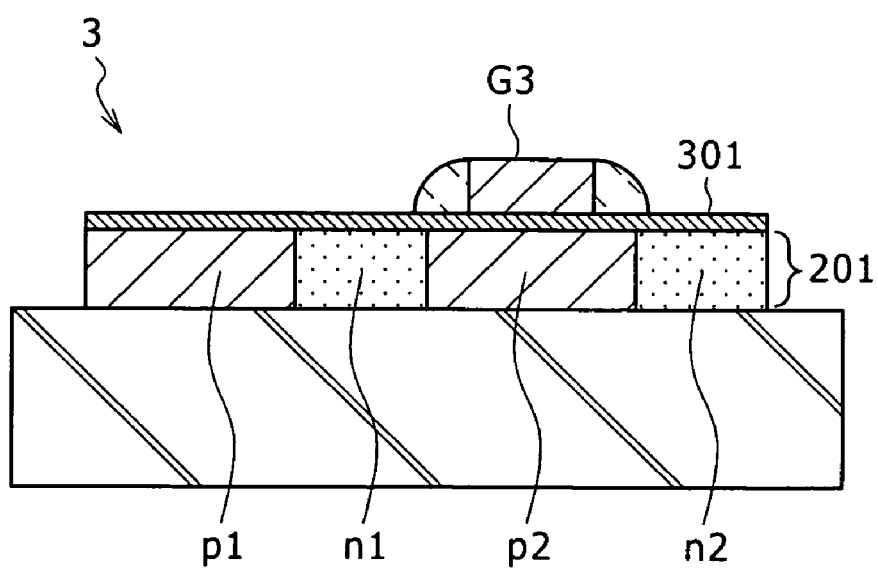

FIGS. 5A and 5B are diagrams schematically illustrating the structure of a semiconductor device according to a third embodiment of the invention. FIG. 5A is a perspective view of the semiconductor device of the third embodiment. FIG. 5B is a sectional view obtained when the plane S in the perspective view of FIG. 5A is viewed in the arrowhead direction. A semiconductor device 3 illustrated in these drawings is different from the semiconductor device 2 of the second embodiment described with FIG. 3, in that an offset insulating film 301 is provided on the upper face of a semiconductor layer 201 so that the effect of a gate electrode G3 reaches a p-region p2 only from the both side faces of the semiconductor layer 201.

That is, in the semiconductor device 3, the gate electrode G3 is provided so that it laterally sandwiches the semiconductor layer 201 as the p-region p2, and is provided over the semiconductor layer 201 with the offset insulating film 301 therebetween. The gate electrode G3 may be formed based on a MOS structure in which an electrode film is deposited over the semiconductor layer 201 with the intermediary of a gate insulating film (not shown) therebetween. Alternatively, the gate electrode G3 may be formed through diffusion bonding of a metal material to the semiconductor layer 201.

The driving method for the semiconductor device 3 with this structure is the same as that for the semiconductor device of the first embodiment.

Also in the semiconductor device 3 with the above-described structure, an electric field can be applied from the gate electrode G3 to the entire p-region p2 efficiently since the gate electrode G3 is provided on two side faces of the intermediate p-region p2, laterally sandwiching the p-region p2. Therefore, similarly to the first embodiment, the speed of switching from the on-state to the effective off-state can be enhanced.

The manufacturing method for the semiconductor device 3 of the third embodiment may be the same as that for the semiconductor device of the second embodiment, except that the offset insulating film 301 is provided on the semiconductor layer 201 in the pattern-formation of the semiconductor layer 201, which corresponds to FIG. 4A for the manufacturing method for the second embodiment. However, in the formation of the p-regions p1 and p2 and the n-regions n1 and n2, it is important to adjust the energies and doses of ion implantation so that sufficient amounts of dopant materials of the respective conductivity types are introduced into the semiconductor layer 201 under the offset insulating film 301. To provide the offset insulating film 301 on the semiconductor layer 201, a semiconductor thin film and an insulating film deposited thereon are patterned into the same shape. As the offset insulating film 301, e.g. a silicon oxide ($SiO_2$) or silicon nitride ($Si_3N_4$) film with a film thickness of about 50 to 200 nm is used. Due to such an offset insulating film 301, an electric field from the gate electrode G3 over the semiconductor layer 201 is blocked and therefore does not reach the semiconductor layer 201 (p-region p2), while only an electric field from the gate electrode G3 on the side faces of the semiconductor layer 201 has an effect on the semiconductor layer 201 (p-region p2).

Fourth Embodiment

Figure 6:
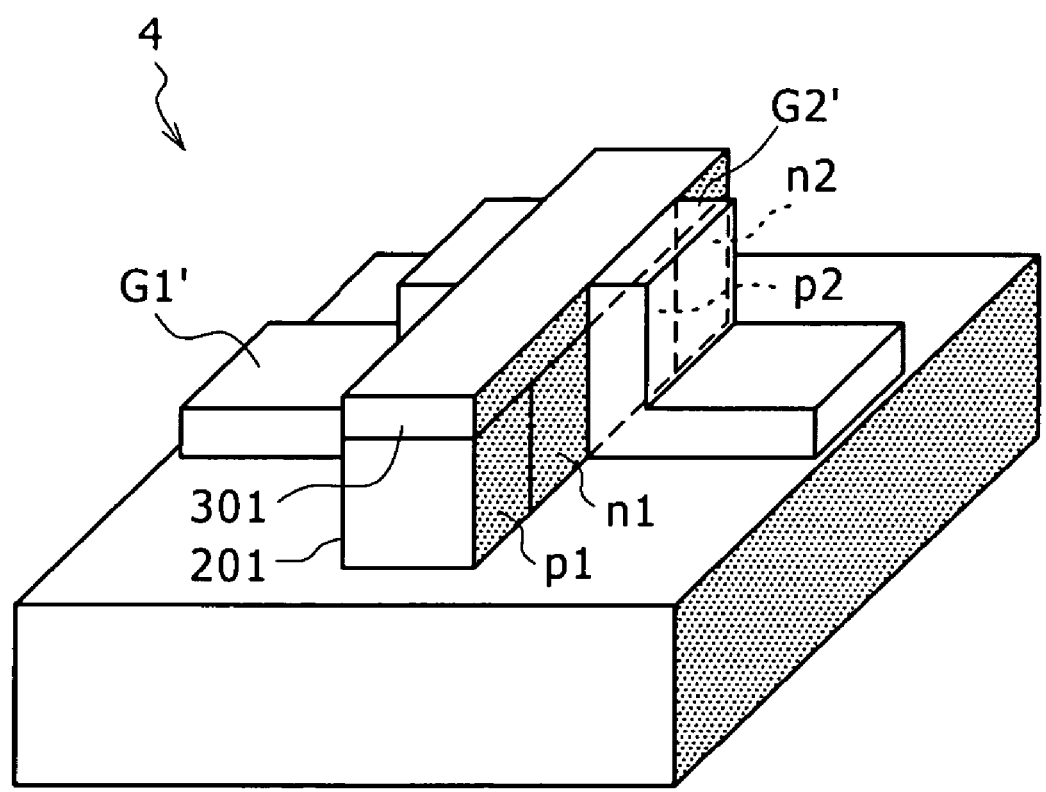
FIG. 6 is a diagram schematically illustrating the structure of a semiconductor device according to a fourth embodiment of the invention.

FIG. 6 is a diagram schematically illustrating the structure of a semiconductor device according to a fourth embodiment of the invention. A semiconductor device 4 in FIG. 6 is different from the semiconductor device 3 of the third embodiment described with FIG. 5A, in that gate electrodes G1' and G2' independent of each other are provided on the both side faces of a p-region p2 in a semiconductor layer 201.

That is, in the semiconductor device 4, the gate electrodes G1' and G2' are provided so that they laterally sandwich the semiconductor layer 201 as the p-region p2, but are eliminated from the position on an offset insulating film 301 above the semiconductor layer 201. These gate electrodes G1' and G2' may be formed based on a MOS structure in which an electrode film is deposited over the semiconductor layer 201 with the intermediary of a gate insulating film (not shown) therebetween. Alternatively, they may be formed through diffusion bonding of a metal material to the semiconductor layer 201.

The driving method for the semiconductor device 4 with this structure is the same as that for the semiconductor device of the first embodiment.

Also in the semiconductor device 4 with the above-described structure, an electric field can be applied from the gate electrodes G1' and G2' to the entire p-region p2 efficiently since these gate electrodes G1' and G2' are provided on two faces of the intermediate p-region p2, sandwiching the p-region p2. Therefore, similarly to the first embodiment, the speed of switching from the on-state to the effective off-state can be enhanced. Furthermore, similarly to the first embodiment, if two gate electrodes G1' and G2' can be controlled independently of each other, applying different potentials to the gate electrodes G1' and G2', respectively, allows finer control of an electric field in the p-region p2.

Figure 7A:
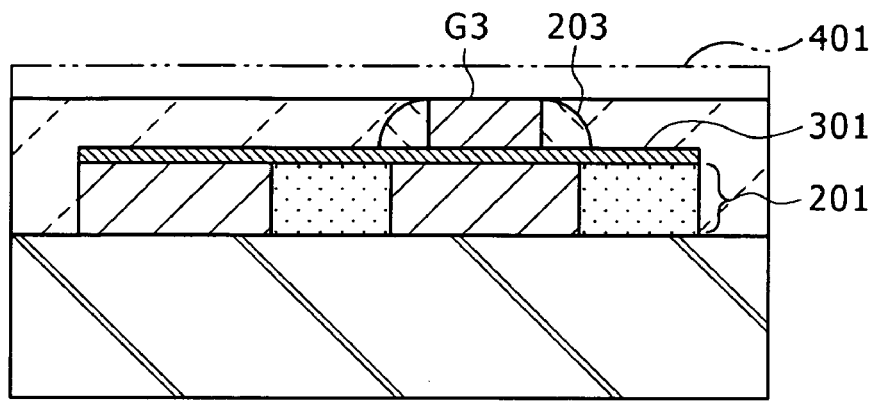
FIGS. 7A and 7B are step diagrams showing a manufacturing method for the semiconductor device of the fourth embodiment.

The semiconductor device 4 of the fourth embodiment can be manufactured by implementing, subsequently to the manufacturing steps for the semiconductor device of the third embodiment, the following steps shown in the sectional views of FIGS. 7A and 7B. Specifically, after the semiconductor device 3 of the third embodiment is formed in the step shown in FIG. 5B, an insulating film 401 is deposited as shown in FIG. 7A so that the gate electrode G3, the offset insulating film 301, the semiconductor layer 201 and the sidewall 203 are buried in the insulating film 401. Subsequently, the insulating film 401 is planarized by CMP. In this CMP, the gate electrode G3 composed of poly-silicon or a metal material serves as the stopper, so that the gate electrode G3 on the offset insulating film 301 is exposed.

Figure 7B:
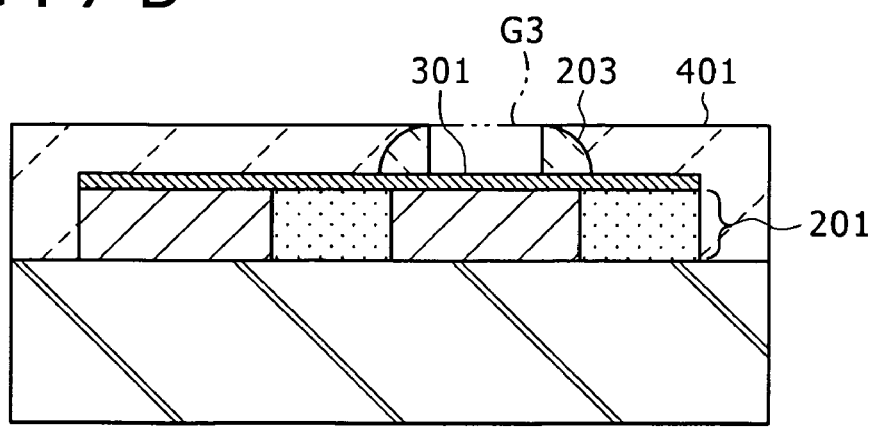

Subsequently, as shown in FIG. 7B, the gate electrode G3 is etch-removed through the exposed part thereof, to thereby expose the offset insulating film 301. Thus, the gate electrode G3 is left only on the sidewalls of the offset insulating film 301 and the semiconductor layer 201 below the film 301. The left part of the gate electrode G3 is pattern-formed into the gate electrodes G1' and G2', not illustrated in the sectional view.

After the above-described step, the insulating film 401 over the offset insulating film 301 and the sidewall 203 are removed by polishing according to need. Alternatively, the insulating film 401 and the sidewall may be left if they are used as interlayer insulating films. In addition, contact holes to the gate electrodes G1' and G2', the p-region p1 and the n-region n2 are opened and metal interconnects are provided although not illustrated in the drawings, so that the semiconductor device 4 of the fourth embodiment described with FIG. 6 can be completed.

In the semiconductor devices of the first to fourth embodiments, the p-region p2 is provided with a gate electrode. However, semiconductor devices of embodiments of the invention may have a structure in which the n-region n1 in an intermediate area is provided with a gate electrode.

In the manufacturing of the semiconductor devices of the first to fourth embodiments, the formation order of the p-region p1 and the n-regions n1 and n2, which are the regions other than the p-region p2 connected to a gate electrode, can be changed according to need. The n-regions n1 and n2 may be formed simultaneously so that they have the respective corresponding carrier concentrations.

In the second to fourth embodiments, the semiconductor devices employ a semiconductor layer having a three-dimensional fin structure that arises from processing of a semiconductor thin film of an SOI substrate into a ridge shape extending in one direction. Instead of this, using a semiconductor wafer (bulk wafer) also allows the construction of the semiconductor devices of the second to fourth embodiments.

Figure 8A:
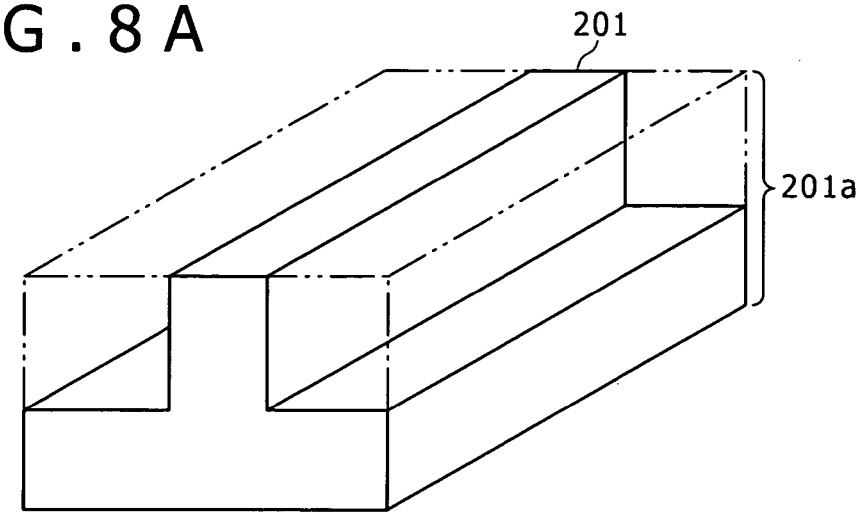
FIGS. 8A to 8C are diagrams showing a modification of the second to fourth embodiments.
Figure 8B:
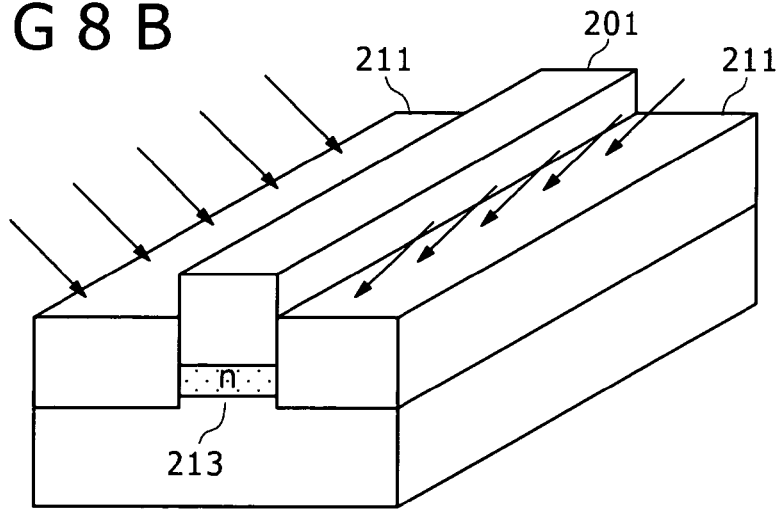
Figure 8C:
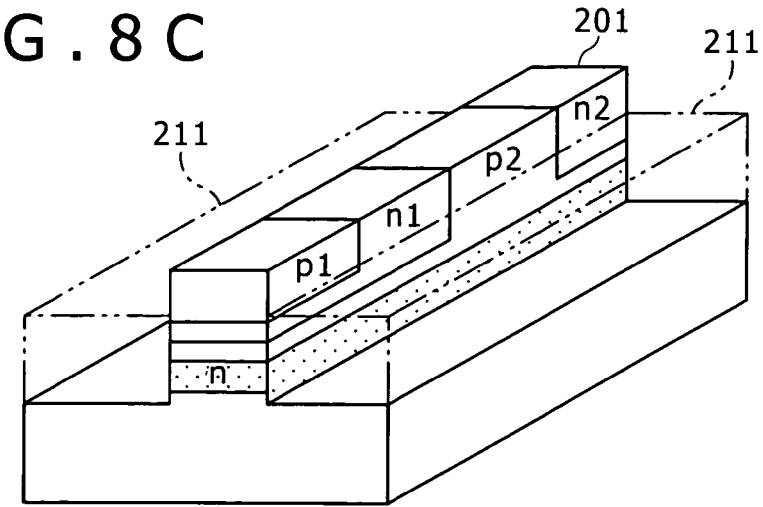

When the semiconductor device of the second embodiment is manufactured from a bulk wafer for example, as shown in FIG. 8A, initially the surface of a semiconductor wafer 201a is subjected to patterning to thereby form a three-dimensional fin structure 201 on the surface of the semiconductor wafer 201a. Referring next to FIG. 8B, a silicon oxide film 211 is deposited to bury therein the fin structure 201, and then the silicon oxide film 211 is polished by CMP until the fin structure 201 is exposed, followed by etch-back of the silicon oxide film 211. Thus, a structure is obtained in which the periphery of the fin structure 201 is surrounded by the silicon oxide film 211 while the upper part of the fin structure 201 is exposed. Subsequently, in order to electrically isolate the fin structure 201 from a base part of the semiconductor wafer 201a, an impurity such as phosphorous, arsenic or antimony is introduced into a lower part of the fin structure 201 by oblique ion implantation to thereby form an n-type pseudo well layer 213. If a logic circuit is also provided on the face of the semiconductor wafer, the logic circuit formation region is covered with a resist pattern before the ion implantation. The fin structure 201 isolated from the base part by the pseudo well layer 213 can be used as the independent semiconductor layer 201. The manufacturing procedure for the second embodiment is carried out for this semiconductor layer 201 to thereby form the semiconductor device of the second embodiment. In the manufacturing procedure, however, the implantation depths of impurities in ion implantation for the formation of the p-regions p1 and p2 and the n-regions n1 and n2 are adjusted so that, as shown in FIG. 8C, the n-regions n1 and n2 are provided on the surface of the p-region p2 and the p-region p1 is provided on the surface of the n-region n1. In addition, it is preferable that the level of the top face of the silicon oxide film 211 be higher than that of the bottom of the p-region p1, which is the shallowest region. According to such a structure, even if electrodes connected to the respective regions are formed on a side face of the fin structure, short-circuit among the respective regions can be avoided. The implantation amounts for forming the n-regions n1 and n2 and the p-regions p1 and p2 are set in consideration of the dose of the n-type impurity introduced in a lower part of the fin structure through the oblique ion implantation.

When the semiconductor device of the third or fourth embodiment is manufactured with use of a semiconductor wafer, initially an offset insulating film is formed on the semiconductor wafer, and then the offset insulating film and the surface of the semiconductor wafer are subjected to patterning. Thus, a three-dimensional fin structure in which the offset insulating film is deposited on the surface of the semiconductor wafer is formed. Subsequently, an n-type pseudo well layer is formed similarly to the above description, and thereafter the manufacturing procedure for the third or fourth embodiment is carried out for the fin structure semiconductor layer isolated from a base part by the pseudo well layer, to thereby form the semiconductor device of the third or fourth embodiment. Similarly to the above description, the implantation amounts for forming the n-regions n1 and n2 and the p-regions p1 and p2 are set in consideration of the dose of the n-type impurity introduced in lower part of the fin structure through the oblique ion implantation.

If a semiconductor wafer is used as described above, higher applicability to mixed products such as mixed logic is achieved and manufacturing costs can be greatly reduced.

Fifth Embodiment

A fifth embodiment of the invention provides a semiconductor device in which any of the thyristor-based semiconductor devices of the first to fourth embodiments is used as one DRAM cell, and a plurality of the DRAM cells are arranged on one substrate. The following description shows an example in which the semiconductor device of the second embodiment is used as one DRAM cell. However, the semiconductor devices of the first, third and fourth embodiments can also be applied similarly.

Figure 9:
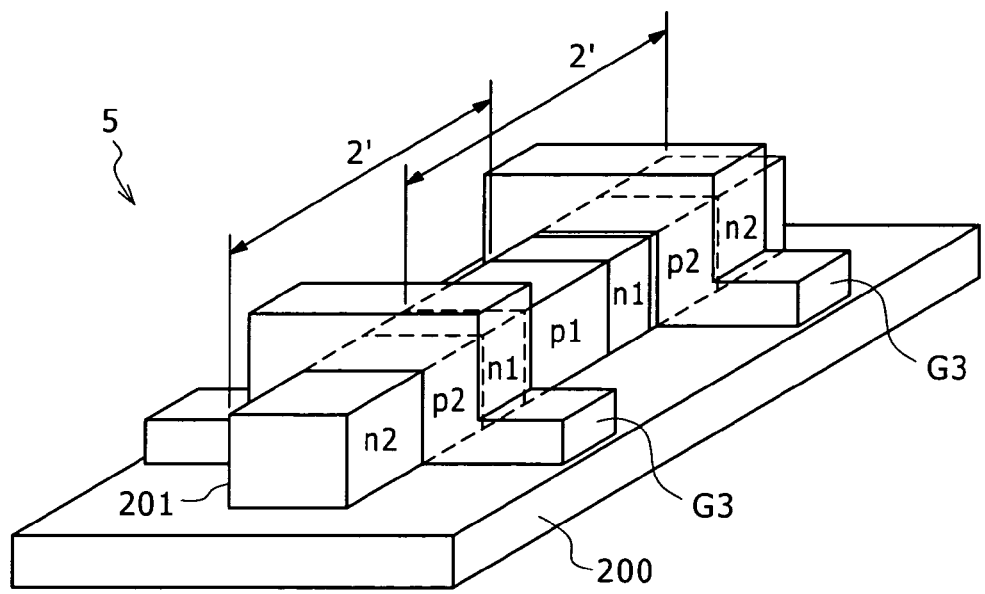
FIG. 9 is a perspective view illustrating the structure of major part of a semiconductor device according to a fifth embodiment of the invention.
Figure 10:
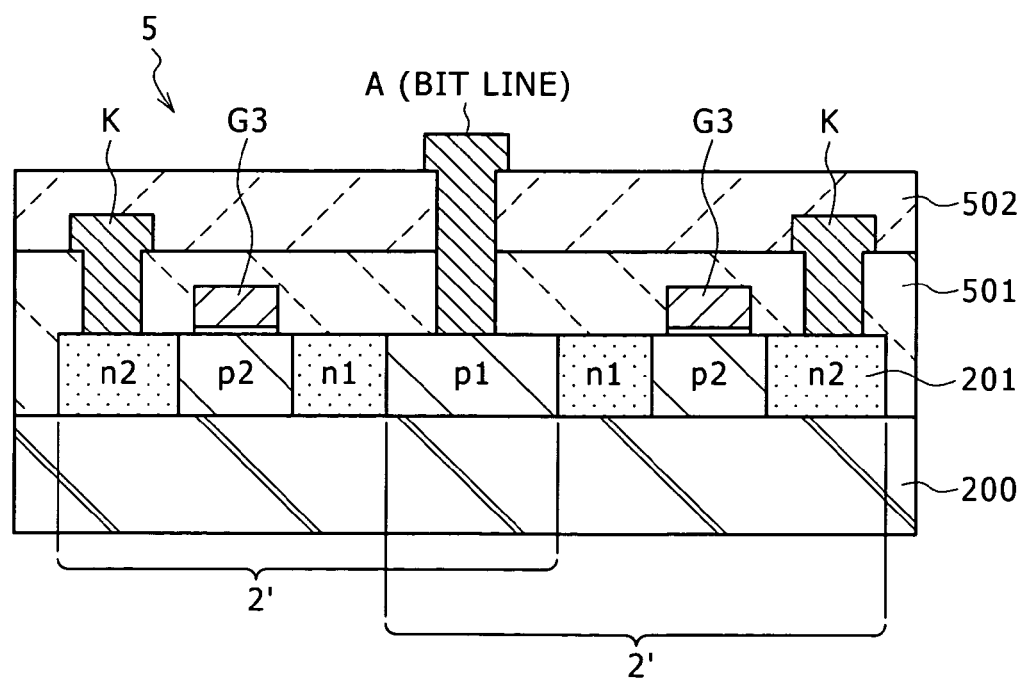
FIG. 10 is a sectional view illustrating the structure of the major part of the semiconductor device of the fifth embodiment.

FIG. 9 is a perspective view schematically illustrating the structure of major part of the semiconductor device of the fifth embodiment. FIG. 10 is a sectional view of FIG. 9. In a semiconductor device 5 shown in these drawings, the semiconductor device (2) shown in FIG. 3 is used as one DRAM cell 2'.

Each DRAM cell 2' includes a semiconductor layer 201 in which, also as described for the second embodiment, a p-region p1, an n-region n1, a p-region p2, and an n-region n2 are adjacent to each other in that order. The semiconductor layer 201 has a three-dimensional fin structure obtained by processing a semiconductor thin film into a ridge shape extending in one direction, similarly to the second embodiment.

In particular, the fifth embodiment is characterized in that two DRAM cells 2' share one p-region p1 at one end of each of the cells. Therefore, the semiconductor layer 201 has a monolithic structure in which the p-region p1 at one end of each of the DRAM cells 2' is disposed at the center of the layer 201, and the n-region n1, the p-region p2 and n-region n2 are adjacent to each other in that order on the both sides of the p-region p1 symmetrically with respect to the p-region p1.

Gate electrodes G3 are individually provided on the p-regions p2 of the respective DRAM cells 2'. Each of these gate electrodes G3 has a continuous shape extending across three faces of the p-region p2, which is one characteristic feature of embodiments of the invention. The gate electrode G3 may be formed based on a MOS structure in which an electrode film is deposited over the semiconductor layer 201 with the intermediary of a gate insulating film (not shown) therebetween. Alternatively, the gate electrode G3 may be formed through diffusion bonding of a metal material to the semiconductor layer 201.

Cathode electrodes K are individually connected to two n-regions n2 at the other ends of the respective DRAM cells 2'. In contrast, an anode electrode A connected to the p-region p1 common to two DRAM cells 2' is used as a bit line, and is shared by two DRAM cells 2' (see FIG. 10).

Figure 11:
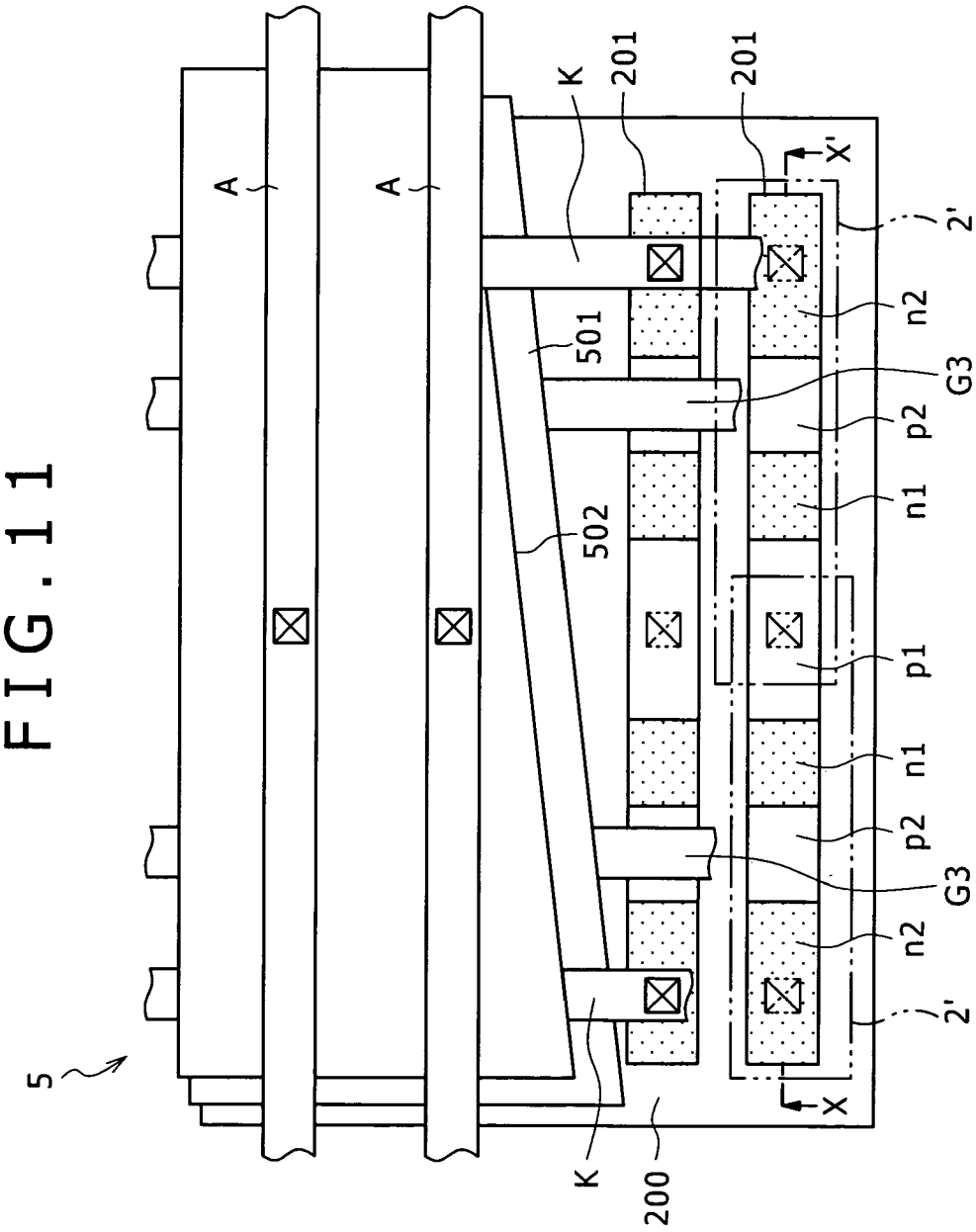
FIG. 11 is a plan view illustrating the structure of the semiconductor device of the fifth embodiment.

FIG. 11 is a plan view of the semiconductor device 5 of the fifth embodiment. FIG. 10 corresponds to the section along the line X-X' in FIG. 11.

As shown in FIG. 11, on an insulating film 200 of the semiconductor device 5, a plurality of the semiconductor layers 201 each including two DRAM cells 2' are arranged across the direction perpendicular to the extension direction of the semiconductor layers 201. In addition, each gate electrode G3 is provided in a manner of traversing the respective p-regions p2 of the plural semiconductor layers 201 so that each gate electrode G3 is shared by the respective DRAM cells 2' of the plural semiconductor layers 201.

Furthermore, as shown in FIGS. 10 and 11, above the insulating film 200 over which the semiconductor layers 201 and the gate electrodes G3 are formed, a first interlayer insulating film 501 is provided to cover them. The cathode electrodes K are provided on the first interlayer insulating film 501. Each cathode electrode K is provided in a manner of traversing the respective n-regions n2 of the plural semiconductor layers 201, and is connected to the respective n-regions n2 through contact holes provided in the first interlayer insulating film 501. Thus, each cathode electrode K is shared by the respective DRAM cells 2' of the plural semiconductor layers 201.

Moreover, a second interlayer insulating film 502 is provided over the first interlayer insulating film 501 in a manner of covering the cathode electrodes K, and anode electrodes (bit lines) A are provided on the second interlayer insulating film 502. Each anode electrode (bit line) A is provided along the corresponding semiconductor layer 201, and is connected to the p-region p1 through a contact hole provided in the second interlayer insulating film 502.

In the driving of the semiconductor device 5 with the above-described structure, data write/erase operation is implemented for the DRAM cell 2' selected through the anode electrode (bit line) A and the gate electrode G3. The driving method for the selected DRAM cell 2' is the same as that for the semiconductor device of the first embodiment. The turn-on and turn-off of the DRAM cell 2' correspond to the data writing and data erasing, respectively.

The manufacturing of the semiconductor device 5 having the above-described structure is carried out through the same method as that for the second embodiment. After the formation of the DRAM cells 2' through the method, the deposition of the first interlayer insulating film 501 and the formation of the cathode electrodes K, the second interlayer insulating film 502 and the anode electrodes (bit lines) A are implemented by use of a typical multilevel interconnect process. However, if a salicide process is carried out for silicidation of the contact parts of the semiconductor layers 201 to the anode electrodes (bit line) A, there is a need to form over the n-regions n1 a salicide block layer for preventing silicidation of the n-regions n1, before the formation of the anode electrodes (bit line) A. The formation of the salicide block layer is carried out between the forming step for the n-regions n1 and the forming step for the p-regions p1 by utilizing a sidewall process. Specifically, after the formation of the n-regions n1, an insulating film such as a silicon nitride film or silicon oxide film is deposited over the entire surface of the semiconductor layers. Subsequently, a resist pattern that covers the entire n-regions n1 and the gate electrodes G3 is formed on the insulating film, followed by etch-back of the entire insulating film through the resist pattern. Thus, a sidewall formed of the insulating film is left on the side faces of the gate electrodes G3 and the fin structures, and a salicide block layer formed of the insulating film is formed on the n-regions n1.

In the semiconductor device 5 with the above-described structure, two thyristor-based DRAM cells 2' share one p-region p1. This structure allows an enhanced degree of integration in the semiconductor device including the plural arranged DRAM cells 2'. Thus, even for DRAM cells after the 32 nm generation in particular, establishment and fabrication of devices in accordance with the scaling rule are possible.

Sixth Embodiment

A sixth embodiment of the invention offers a semiconductor device that includes SRAM cells each employing the above-described thyristor-based semiconductor device. The following description shows an example in which the semiconductor device (thyristor) of the second embodiment is used. However, the semiconductor devices of the first, third and fourth embodiments can also be applied similarly.

Figure 12:
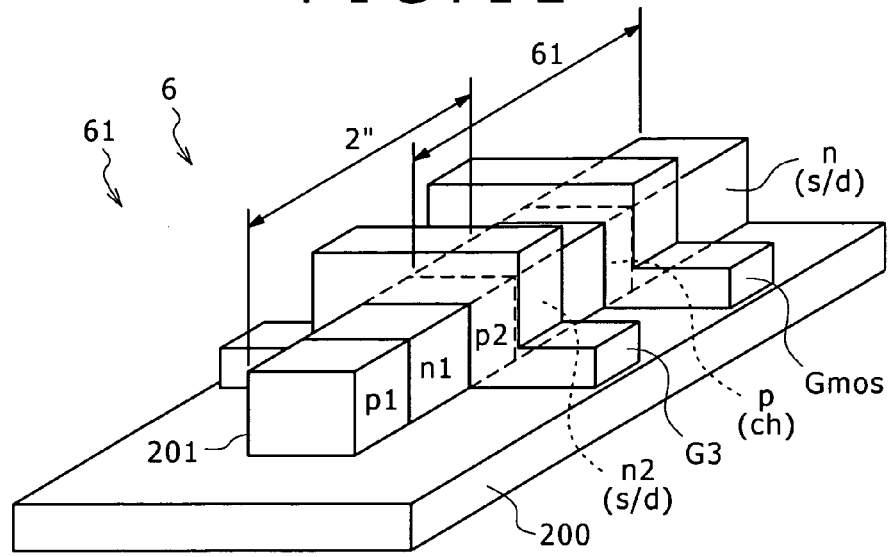
FIG. 12 is a perspective view illustrating the structure of a major part of a semiconductor device according to a sixth embodiment of the invention.
Figure 13:
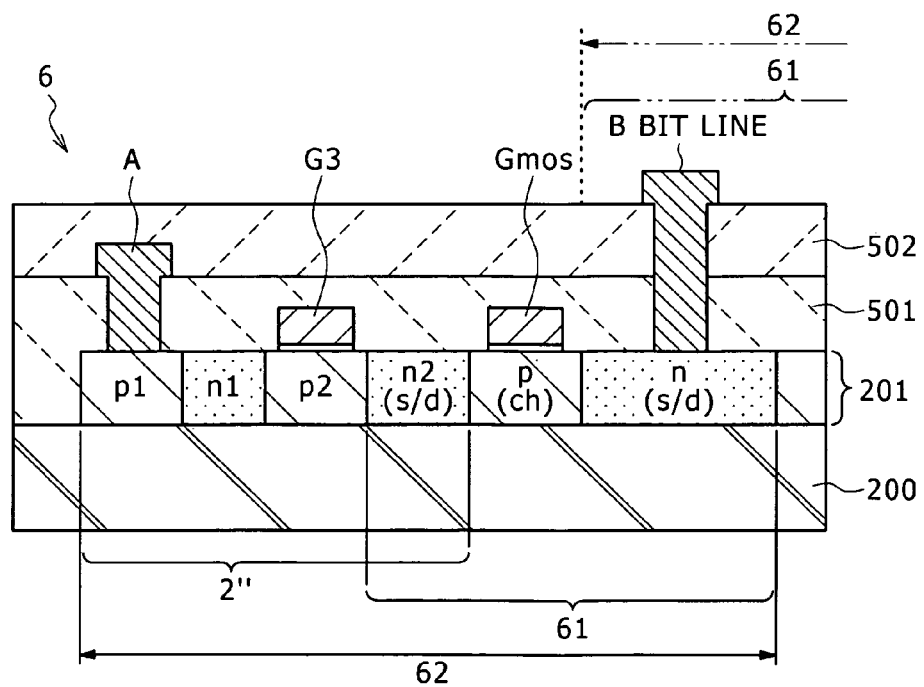
FIG. 13 is a sectional view illustrating the structure of the major part of the semiconductor device of the sixth embodiment.

FIG. 12 is a perspective view schematically illustrating the structure of major part of the semiconductor device of the sixth embodiment. FIG. 13 is a sectional view of FIG. 12. A semiconductor device 6 shown in these drawings includes SRAM cells 62. Each SRAM cell 62 includes the semiconductor device (2) shown in FIG. 3, i.e., a thyristor 2" and a MOS transistor 61.

The MOS transistor 61 includes a semiconductor layer in which a p-region p(ch) serving as the channel region is sandwiched between two n-regions n(s/d) and n2(s/d) serving as the source/drain regions. The semiconductor layer has a three-dimensional fin structure obtained by processing a semiconductor thin film into a ridge shape extending in one direction, similarly to the semiconductor layer of the thyristor 2".

In particular, the sixth embodiment is characterized in that the thyristor 2" and the transistor 61 share the n-region at one end of each of these elements. As shown in the drawings, the n-type diffusion layer n2 of the thyristor 2" and the n-region n2(s/d) of the MOS transistor 61 are provided as the same region. Therefore, in a semiconductor layer 201, a p-region p1, an n-region n1, a p-region p2, the n-region n2(s/d), the p-region p(ch) and the n-region n(s/d) are monolithically adjacent to each other in that order from one end of the semiconductor layer 201 (from the left end, in the drawings).

In addition, a gate electrode Gmos is provided over the p-region p(ch) as the channel of the MOS transistor 61 with the intermediary of a gate insulating film therebetween. The gate electrode Gmos may have the same structure as that of a gate electrode G3 provided for the thyristor 2". Specifically, these gate electrodes G3 and Gmos have a continuous shape extending across three faces of the p-region p2 and the p-region p(ch) as the channel, respectively, which is one characteristic feature of embodiments of the invention. If these gate electrodes G3 and Gmos are formed in the same step, both the gate electrodes G3 and Gmos are formed to have a MOS structure, in which an electrode film is provided on a gate insulating film. In contrast, if the gate electrodes G3 and Gmos are formed in different steps separately, the gate electrode G3 may be formed through diffusion bonding of a metal material to the semiconductor layer 201.

The n-region n(s/d), which is included in the MOS transistor 61, is connected to a bit line B. The p-region p1 of the thyristor 2" is connected to an anode electrode A.

Another characteristic feature of the sixth embodiment is that two SRAM cells 62 with the above-described structure share one n-region n(s/d) of the MOS transistor 61, provided at one end of each of the two SRAM cells 62. Therefore, the semiconductor layer 201 has a monolithic structure in which the p-region p(ch), the n-region n2(s/d), the p-region p2, the n-region n1, and the p-region p1 are adjacent to each other in that order on the both sides of the n-region n(s/d) at one end of the SRAM cell 62 symmetrically with respect to the n-region n(s/d).

Furthermore, the bit line B, which is connected to the n-region n(s/d) shared by two SRAM cells 62, is also shared by the two SRAM cells 62. In contrast, the gate electrodes G3 and Gmos and the anode electrode A are separately provided for each of the two SRAM cells 62.

Figure 14:
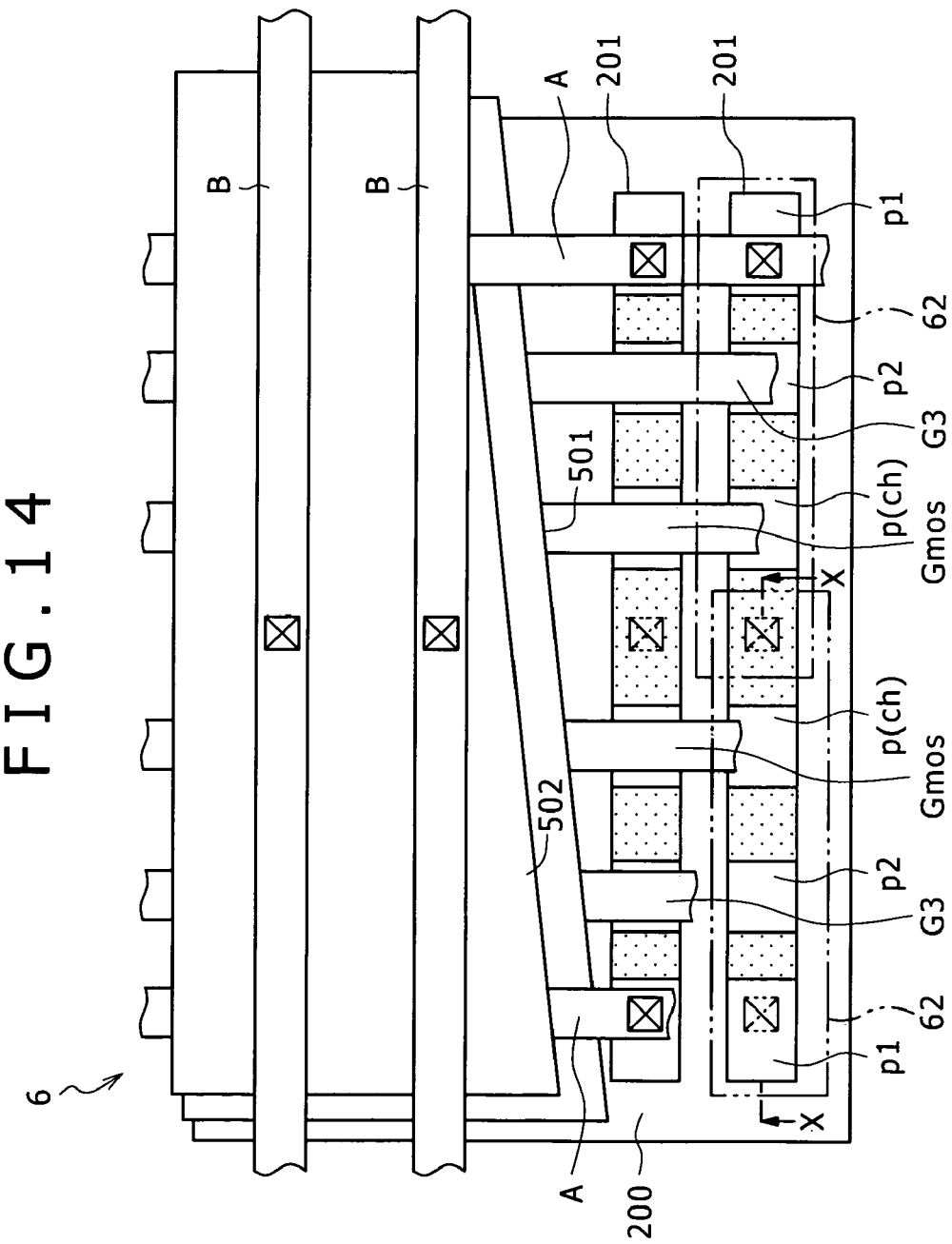
FIG. 14 is a plan view illustrating the structure of the semiconductor device of the sixth embodiment.

FIG. 14 is a plan view of the semiconductor device 6 of the sixth embodiment. FIG. 13 corresponds to the section along the line X-X' in FIG. 14.

As shown in FIG. 14, on an insulating film 200 of the semiconductor device 6, a plurality of the semiconductor layers 201 each including two SRAM cells 62 are arranged across the direction perpendicular to the extension direction of the semiconductor layers 201. In addition, each gate electrode G3 is provided in a manner of traversing the respective p-regions p2 of the plural semiconductor layers 201 and each gate electrode Gmos is provided in a manner of traversing the respective p-regions p(ch) of the plural semiconductor layers 201. Thus, each of the gate electrodes G3 and Gmos is shared by the respective SRAM cells 62 of the plural semiconductor layers 201.

Furthermore, above the insulating film 200 over which the semiconductor layers 201 and the gate electrodes G3 and Gmos are formed, a first interlayer insulating film 501 is provided to cover them. Two anode electrodes A are provided on the first interlayer insulating film 501. Each anode electrode A is provided in a manner of traversing the respective p-regions p1 of the plural semiconductor layers 201, and is connected to the respective p-regions p1 through contact holes provided in the first interlayer insulating film 501. Thus, each anode electrode A is shared by the respective SRAM cells 62 of the plural semiconductor layers 201.

Moreover, a second interlayer insulating film 502 is provided over the first interlayer insulating film 501 in a manner of covering the anode electrodes A, and the bit lines B are provided on the second interlayer insulating film 502. Each bit line B is provided along the corresponding semiconductor layer 201, and is connected to the n-region n(s/d) through a contact hole provided in the second interlayer insulating film 502. Thus, each bit line B is shared by two SRAM cells 62 included in one semiconductor layer 201.

In the driving of the semiconductor device 6 with the above-described structure, data write/erase operation is implemented for the SRAM cell 62 selected through the bit line B and the gate electrode Gmos. In the driving of the selected SRAM cell 62, a voltage is applied to the gate electrode Gmos of the MOS transistor 61 to thereby provide the n-region n2(s/d) with a potential, and the thyristor 2" is driven by the same driving method as that for the semiconductor device of the first embodiment, with the potential applied to the n-region n2(s/d) serving as the cathode potential. The turn-on and turn-off of the thyristor 2" correspond to the data writing and data erasing, respectively.

The semiconductor device 6 with the above-described structure can be manufactured through the manufacturing procedure arising from addition of modifications to the following two steps in the manufacturing procedure for the second embodiment.

As one modification, in the step of forming the gate electrode G3, described with FIG. 4B, the gate electrode Gmos of the MOS transistor 61 is also formed simultaneously. The impurity concentration of the channel p-region p(ch) below the gate electrode Gmos is equal to that of the p-region p2.

As the other modification, in the step of forming the n-region n2, described with FIG. 4E, a resist pattern is formed that exposes the region in which the MOS transistor 61 is to be formed. Through ion implantation with use of the resist pattern and the gate electrodes G3 and Gmos as the mask and subsequent annealing, the n-regions n(s/d) and n2(s/d) of the MOS transistor 61 are formed. In this ion implantation, the n-type dopant to be introduced for the n-regions n(s/d) and n2(s/d) is e.g. phosphorous (P), and the dose thereof is e.g. 5E20/cm$^3$, and is preferably about 1E18 to 5E21/cm$^3$. In addition, similarly to the n-region n2, since the n-regions n(s/d) and n2(s/d) are provided inside the pre-formed p-region p2, the concentration of the n-type dopant to be introduced for the n-regions n(s/d) and n2(s/d) needs to be higher than that of the p-type dopant introduced for the p-region p2. Furthermore, the n-type dopant may be arsenic (As) or antimony (Sb) instead of phosphorous (P). Moreover, in this step, pocket implantation, halo implantation, LDD implantation or extension implantation into a region below the gate electrode Gmos may be implemented by oblique ion implantation according to need.

After the formation of the SRAM cells 62 through the above-described steps, the deposition of the first interlayer insulating film 501 and the formation of the anode electrodes A, the second interlayer insulating film 502 and the bit lines B are implemented by use of a typical multilevel interconnect process. Similarly to the fifth embodiment, if a salicide process is carried out for silicidation of the contact parts of the semiconductor layers 201 to the anode electrodes A, there is a need to form a salicide block layer for preventing silicidation of the n-regions n1.

In the semiconductor device 6 with the above-described structure, the thyristor 2" and the MOS transistor 61 included in one SRAM cell 62 share one n-region n2(s/d). Furthermore, two SRAM cells 62 share the n-region n(s/d) included in the MOS transistors 61 of these SRAM cells 62. This structure allows an enhanced degree of integration in the semiconductor device 6 including the plural arranged SRAM cells 62. Thus, even for SRAM cells after the 32-nm generation in particular, establishment and fabrication of devices in accordance with the scaling rule are possible.

In the above-described sixth embodiment, an SRAM cell arising from a combination of a thyristor and a MOS transistor is fabricated in a series of a semiconductor layer, with a region at one end of the thyristor and one of the source and drain of the MOS transistor being the same region. Alternatively, another SRAM cell structure is also available in which a semiconductor layer of a thyristor is completely separated from a semiconductor layer of a MOS transistor. In this case, the n-region n2 of the thyristor is coupled to the n-region n2(s/d) of the MOS transistor as one of the source and drain thereof via a contact or local interconnection.

This structure can offer complete prevention of formation of parasitic thyristor and parasitic bipolar between the thyristor and MOS transistor.

If the p-type and n-type are exchanged with each other in the first to sixth embodiments, the anode A is replaced by the cathode K and vice versa, but all other points may be the same. However, since the polarities of input and output signals are also reversed between high and low levels, the configurations of peripheral circuits and so on need to be adequately changed in accordance with this reversal.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a semiconductor layer that includes a first-conductivity-type region, a second-conductivity-type region, a first-conductivity-type region, and a second-conductivity-type region that are adjacent to each other in that order;
   first and second electrodes that are connected to the first-conductivity-type region and the second-conductivity-type region, respectively, at both ends of the semiconductor layer; and
   a gate electrode that is coupled to the second-conductivity-type region or the first-conductivity-type region in an intermediate area of the semiconductor layer, the gate electrode being provided over a plurality of faces of a semiconductor layer portion serving as the second-conductivity-type region or the first-conductivity-type region in the intermediate area.

2. The semiconductor device according to claim 1, wherein
   the gate electrode is opposed to each other with intermediary of the semiconductor layer portion.

3. The semiconductor device according to claim 2, wherein
   the semiconductor layer is formed of a semiconductor thin film provided on an insulating substrate, and
   the gate electrode is provided above and below the semiconductor layer portion in the semiconductor thin film.

4. The semiconductor device according to claim 1, wherein
   the semiconductor layer has a three-dimensional structure portion formed upright into a ridge shape, and the respective regions are sequentially formed along an extension direction of the ridge shape, and
   the gate electrode has a continuous shape across three faces of the semiconductor layer portion in the semiconductor layer having the ridge shape.

5. The semiconductor device according to claim 1, wherein
   the gate electrode provided over the plurality of faces of the semiconductor layer portion is a plurality of gate electrodes that are controlled independently of each other.

6. The semiconductor device according to claim 1, wherein
   the gate electrode is provided over the semiconductor layer portion with intermediary of an insulating film so that a metal-oxide-semiconductor (MOS) structure is obtained.

7. The semiconductor device according to claim 1, wherein
   the semiconductor layer, the first and second electrodes, and the gate electrode construct one device cell, and
   the semiconductor layers of two device cells are monolithic so that the two device cells share the first-conductivity-type region at an end of each of the semiconductor layers.

8. The semiconductor device according to claim 1, wherein
   the semiconductor layer, the first and second electrodes, and the gate electrode construct a first element,
   the first element is combined with a second element that includes a semiconductor layer and a gate electrode, the semiconductor layer of the second element including a second-conductivity-type region, a first-conductivity-type region and a second-conductivity-type region that are adjacent to each other in that order, the gate electrode of the second element being coupled to the first-conductivity-type region of the second element, and
   the semiconductor layer of the first element and the semiconductor layer of the second element are monolithic so that the second-conductivity-type region at an end of the semiconductor layer of the first element and one of the second-conductivity-type regions in the semiconductor layer of the second element are the same region.

9. The semiconductor device according to claim 8, wherein
the first element and the second element construct one device cell, and
the semiconductor layers of two device cells are monolithic so that the two device cells share the other of the second-conductivity-type regions of the second element at an end of each of the semiconductor layers.

10. A method for manufacturing a semiconductor device as set forth in claim 1, comprising:
the first step of forming a first-conductivity-type region in surface part of a semiconductor substrate;
the second step of forming a first gate electrode over the semiconductor substrate, the first gate electrode traversing an intermediate area of the first-conductivity-type region;
the third step of forming an insulating film over the semiconductor substrate so that the first gate electrode is covered, and applying a handle substrate to the semiconductor substrate with intermediary of the insulating film;
the fourth step of polishing the semiconductor substrate applied to the handle substrate from a backside of the semiconductor substrate until the first-conductivity-type region is exposed, so that the semiconductor substrate is processed into a semiconductor thin film;
the fifth step of forming a second gate electrode over the semiconductor thin film so that the first-conductivity-type region is sandwiched between the first and second gate electrodes; and
the sixth step, between the second and third steps or after the fifth step, of sequentially implementing impurity introduction into the semiconductor substrate or the semiconductor thin film with use of a mask so that a first-conductivity-type region, a second-conductivity-type region, the first-conductivity-type region over which the first gate electrode has been formed, and a second-conductivity-type region are arranged in that order along a direction perpendicular to an extension direction of the first gate electrode.

11. A method for manufacturing a semiconductor device as set forth in claim 1, comprising:
the first step of forming a first gate electrode over a semiconductor substrate;
the second step of forming an insulating film over the semiconductor substrate so that the first gate electrode is covered, and applying a handle substrate to the semiconductor substrate with intermediary of the insulating film;
the third step of polishing the semiconductor substrate applied to the handle substrate from a backside of the semiconductor substrate, so that the semiconductor substrate is processed into a semiconductor thin film;
the fourth step of forming a first-conductivity-type region in the semiconductor thin film so that the first-conductivity-type region is coupled to at least the first gate electrode;
the fifth step of forming a second gate electrode over the semiconductor thin film so that the first-conductivity-type region is sandwiched between the first and second gate electrodes; and
the sixth step of sequentially implementing impurity introduction into the semiconductor thin film with use of a mask so that a first-conductivity-type region, a second-conductivity-type region, the first-conductivity-type region sandwiched between the first and second gate electrodes, and a second-conductivity-type region are arranged in that order along a direction perpendicular to an extension direction of the first gate electrode.

12. A method for manufacturing a semiconductor device as set forth in claim 1, comprising the steps of:
pattern-forming over a substrate a semiconductor layer that has a three-dimensional structure portion formed upright into a ridge shape;
turning the semiconductor layer into a first-conductivity-type region;
forming a gate electrode that has a shape traversing the semiconductor layer having the ridge shape and is coupled to the first-conductivity-type region through three faces of the semiconductor layer; and
sequentially implementing impurity introduction into the semiconductor layer with use of a mask so that a first-conductivity-type region, a second-conductivity-type region, the first-conductivity-type region coupled to the gate electrode, and a second-conductivity-type region are arranged in that order along an extension direction of the ridge shape.

* * * * *

UNITED STATES PATENT AND TRADEMARK OFFICE
CERTIFICATE OF CORRECTION

| | | |
|---|---|---|
| PATENT NO. | : 7,365,372 B2 | |
| APPLICATION NO. | : 11/482693 | |
| DATED | : April 29, 2008 | |
| INVENTOR(S) | : Taro Sugizaki et al. | |

It is certified that error appears in the above-identified patent and that said Letters Patent is hereby corrected as shown below:

Title Page:
Item (75) should read:
-- Taro Sugizaki, Kanagawa (JP) --.

Signed and Sealed this

Eighth Day of July, 2008

JON W. DUDAS
*Director of the United States Patent and Trademark Office*